(12) United States Patent
Zou et al.

(10) Patent No.: US 11,749,179 B2
(45) Date of Patent: Sep. 5, 2023

(54) DISPLAY PANEL, DETECTION METHOD THEREOF AND DISPLAY DEVICE

(71) Applicant: Xiamen Tianma Micro-Electronics Co., Ltd., Xiamen (CN)

(72) Inventors: Zongjun Zou, Xiamen (CN); Ying Sun, Xiamen (CN); Yumin Xu, Xiamen (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 0 days.

(21) Appl. No.: 17/631,472

(22) PCT Filed: Jan. 18, 2021

(86) PCT No.: PCT/CN2021/072426
§ 371 (c)(1),
(2) Date: Aug. 5, 2022

(87) PCT Pub. No.: WO2022/116371
PCT Pub. Date: Jun. 9, 2022

(65) Prior Publication Data
US 2022/0366837 A1   Nov. 17, 2022

(30) Foreign Application Priority Data
Dec. 4, 2020   (CN) .......................... 202011409345.4

(51) Int. Cl.
   G09G 3/32        (2016.01)
   G09G 3/00        (2006.01)
(52) U.S. Cl.
   CPC ............... *G09G 3/32* (2013.01); *G09G 3/006* (2013.01); *G09G 2300/0408* (2013.01);
   (Continued)

(58) Field of Classification Search
   CPC ........... G09G 2300/0408; G09G 3/006; G09G 2310/0267; G09G 3/32; G09G 2310/0286;
   (Continued)

(56) References Cited

U.S. PATENT DOCUMENTS

| 7,366,274 B2* | 4/2008 | Tseng ..................... G11C 19/00 377/64 |
| 8,059,780 B2 | 11/2011 | Wang et al. |
| 10,431,143 B2* | 10/2019 | Zhang ..................... G09G 3/20 |
| 10,553,166 B2* | 2/2020 | Seo ....................... G09G 3/3677 |

(Continued)

FOREIGN PATENT DOCUMENTS

| CN | 103268879 A | 8/2013 |
| CN | 104536627 A | 4/2015 |
| CN | 104681000 A | 6/2015 |
| CN | 105118463 A | 12/2015 |
| CN | 107301001 A | 10/2017 |

(Continued)

OTHER PUBLICATIONS

Office Action of CN Patent Application No. 202011409345.4.

*Primary Examiner* — Muhammad N Edun
(74) *Attorney, Agent, or Firm* — Kilpatrick Townsend & Stockton, LLP

(57) ABSTRACT

A display panel includes a scan driving circuit, signal pins and a first gating circuit. Signal pins include a detection signal pin and an enable signal pin. The scan driving circuit includes scan drive units disposed in a cascade manner. The first gating circuit includes a first switch unit and a second switch unit. An input terminal of the first switch unit is electrically connected to a scan signal detection terminal of an Nth-stage scan drive unit. An input terminal of the second switch unit is electrically connected to a scan signal detection terminal of a first-stage scan drive unit. An output terminal of the first switch unit and an output terminal of the second switch unit are both electrically connected to the detection signal pin. The first switch unit is configured to turn on in a forward scan detection stage and turn off in a backward scan detection stage. The second switch unit is (Continued)

configured to turn on in the backward scan detection stage and turn off in the backward scan detection stage.

20 Claims, 22 Drawing Sheets

(52) U.S. Cl.
CPC ............... *G09G 2310/0267* (2013.01); *G09G 2310/0283* (2013.01); *G09G 2310/0286* (2013.01)

(58) Field of Classification Search
CPC ............. G09G 2300/0426; G09G 3/20; G09G 2310/0283; G11C 19/28
See application file for complete search history.

(56) References Cited

U.S. PATENT DOCUMENTS

| | | | |
|---|---|---|---|
| 2005/0206606 A1 | 9/2005 | Takafuji et al. | |
| 2011/0058640 A1* | 3/2011 | Shang .................. | G11C 19/184 377/64 |

FOREIGN PATENT DOCUMENTS

| | | | |
|---|---|---|---|
| CN | 107479766 | A | 12/2017 |
| CN | 107767806 | A | 3/2018 |
| CN | 108648671 | A | 10/2018 |
| CN | 108648703 | A | 10/2018 |
| CN | 110299110 | A | 10/2019 |
| CN | 111599308 | A | 8/2020 |
| CN | 211237679 | U | 8/2020 |

\* cited by examiner

In the forward scan detection stage, supply a start signal and the multi-stage scan drive units from the first-stage scan drive unit to the Nth-stage scan drive unit successively output shift signals and scan signals; control the first switch unit to turn on and the second switch unit to turn off, receive a signal of the scan signal detection terminal of the Nth-stage scan drive unit as the forward scan detection signal through the first switch unit, and detect the forward scan function of the scan driving circuit according to the forward scan detection signal ~ S110

In the backward scan detection stage, supply a start signal and the multi-stage scan drive units from the Nth-stage scan drive unit to the first-stage scan drive unit successively output shift signals and scan signals; control the first switch unit to turn off and the second switch unit to turn on, receive a signal of the scan signal detection terminal of the first-stage scan drive unit as the backward scan detection signal through the second switch unit, and detect the backward scan function of the scan driving circuit according to the backward scan detection signal ~ S120

FIG. 24

In the first stage, turn the third switch unit on, turn the fourth switch unit off, and output a start signal to the start signal transmission line through the third switch unit such that the multi-stage scan drive units from the Nth-stage scan drive unit to the first-stage scan drive unit successively output scan signals and shift signals ~ S121

In the second stage, turn the second switch unit and the fourth switch unit on, turn the first switch unit and the third switch unit off, and output the backward scan detection signal, by the switch module, according to a signal of the scan signal detection terminal of the first-stage scan drive unit ~ S122

In the third stage, receive the backward scan detection signal through the start signal transmission line, the fourth switch unit and the second switch unit, and detect the backward scan function of the scan driving circuit according to the backward scan detection signal ~ S123

FIG. 25

DISPLAY PANEL, DETECTION METHOD THEREOF AND DISPLAY DEVICE

CROSS-REFERENCE TO RELATED APPLICATION(S)

This is a national stage application filed under 37 U.S.C. 371 based on International Patent Application No. PCT/CN2021/072426, filed Jan. 18, 2021, which claims priority to Chinese Patent Application No. 202011409345.4 filed with the China National Intellectual Property Administration (CNIPA) on Dec. 4, 2020, the disclosure of which are incorporated herein by reference in their entireties.

FIELD

The present application relates to the field of display technology and, for example, to a display panel, a detection method thereof and a display device.

BACKGROUND

A gate switch circuit of a thin-film transistor (TFT) is integrated on the array substrate of a display panel by use of the gate driver on array (GOA) technology to form a scan drive for the display panel so that a gate driver chip can be omitted.

The GOA circuit is composed of cascaded shift registers and can have a bidirectional scan function: a forward scan and a backward scan. The output terminal of each stage of shift register of the GOA circuit is connected to gates of switch transistors in a respective row of pixel units to drive the respective row of pixel units. In the existing art, a finished or semi-finished display panel is often detected to determine whether multiple structures inside the display panel function normally. For example, the GOA circuit inside the display panel is detected to determine whether the GOA circuit can function normally.

However, in the existing art, only one scan direction of the GOA circuit having a bidirectional scan function can be detected, that is, it is impossible to detect both the forward scan function and the backward scan function of the GOA circuit having a bidirectional function.

SUMMARY

Embodiments of the present application provide a display panel, a detection method thereof and a display device. The forward scan function and the backward scan function of the scan driving circuit in the display panel can be detected by use of a simple structure.

A display panel is provided. The display panel includes multiple signal pins, a scan driving circuit, multiple scan signal lines and a first gating circuit.

The multiple signal pins include at least a start signal pin and a detection signal pin.

The scan driving circuit includes N scan drive units disposed in a cascade manner, and N is a positive integer greater than or equal to 2. Scan signal output terminals of the N scan drive units are electrically connected to the multiple scan signal lines with a one-to-one correspondence. For each of the N scan drive units, a forward scan input terminal of a current-stage scan drive unit is electrically connected to a shift signal output terminal of a previous-stage scan drive unit of the current-stage scan drive unit. A backward scan input terminal of the current-stage scan drive unit is electrically connected to a shift signal output terminal of a next-stage scan drive unit of the current-stage scan drive unit. A forward scan input terminal of a first-stage scan drive unit and a backward scan input terminal of an Nth-stage scan drive unit are both electrically connected to the start signal pin, where the current-stage scan drive unit is not the first-stage scan drive unit and not the Nth-stage scan drive unit.

The first gating circuit includes a first switch unit and a second switch unit. An input terminal of the first switch unit is electrically connected to a scan signal detection terminal of the Nth-stage scan drive unit. An input terminal of the second switch unit is electrically connected to a scan signal detection terminal of the first-stage scan drive unit. An output terminal of the first switch unit and an output terminal of the second switch unit are both electrically connected to the detection signal pin. The first switch unit is configured to turn on in a forward scan detection stage and turn off in a backward scan detection stage. The second switch unit is configured to turn on in the backward scan detection stage and turn off in the forward scan detection stage. The scan signal detection terminal of the Nth-stage scan drive unit is a shift signal output terminal of the Nth-stage scan drive unit or a scan signal output terminal of the Nth-stage scan drive unit, and the scan signal detection terminal of the first-stage scan drive unit is a shift signal output terminal of the first-stage scan drive unit or a scan signal output terminal of the first-stage scan drive unit.

A detection method of a display panel is further provided. The detection method is applicable to the preceding display panel and includes at least a forward scan detection stage and a backward scan detection stage.

In the forward scan detection stage, a start signal is supplied by the start signal pin and the multi-stage scan drive units from the first-stage scan drive unit to the Nth-stage scan drive unit successively output shift signals and scan signals; the first switch unit is controlled to turn on, the second switch unit is controlled to turn off, a signal of the scan signal detection terminal of the Nth-stage scan drive unit is received as a forward scan detection signal through the first switch unit, and a forward scan function of the scan driving circuit is detected according to the forward scan detection signal, and the forward scan detection signal is a shift signal output from the Nth-stage scan drive unit or a scan signal output from the Nth-stage scan drive unit.

In the backward scan detection stage, a start signal is supplied by the start signal pin and the multi-stage scan drive units from the Nth-stage scan drive unit to the first-stage scan drive unit successively output shift signals and scan signals; the first switch unit is controlled to turn off, the second switch unit is controlled to turn on, a signal of the scan signal detection terminal of the first-stage scan drive unit is received as a backward scan detection signal through the second switch unit, and a backward scan function of the scan driving circuit is detected according to the backward scan detection signal, and the backward scan detection signal is a shift signal output from the first-stage scan drive unit or a scan signal output from the first-stage scan drive unit.

A display device is further provided. The display device includes the preceding display panel.

BRIEF DESCRIPTION OF DRAWINGS

FIG. 24 is a flowchart illustrating a detection method according to embodiments of the present application.

FIG. 25 is a flowchart illustrating a backward scan detection method according to embodiments of the present application.

DETAILED DESCRIPTION

Figure 1:
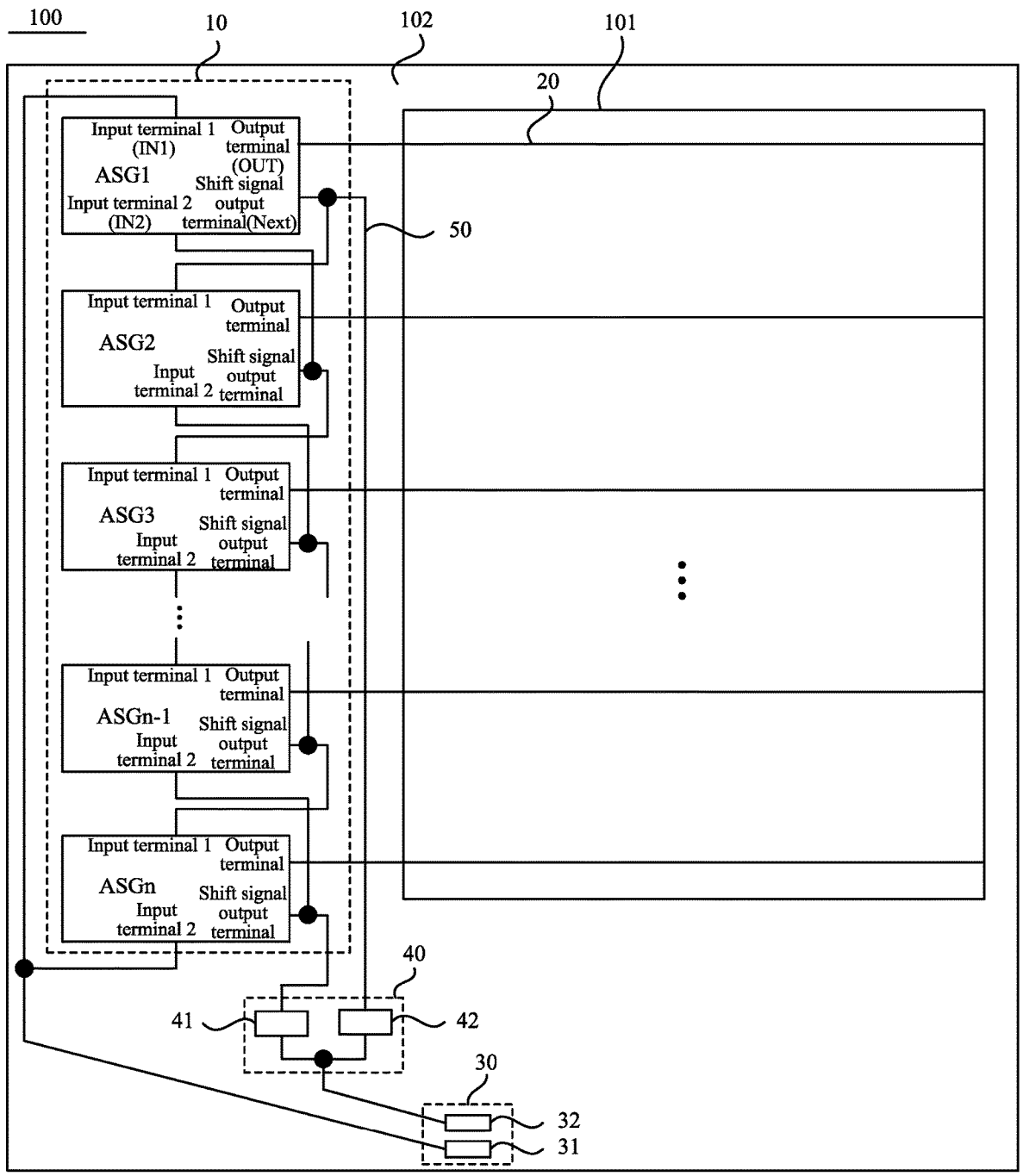
FIG. 1 is a diagram illustrating the structure of a display panel according to embodiments of the present application.

The present application is described hereinafter in detail in conjunction with drawings and embodiments. The embodiments described herein are intended to illustrate and not to limit the present application. Additionally, for ease of description, only part, not all, of the structures related to the present application are illustrated in the drawings.

When the scan driving circuit having a bidirectional scan function is detected, with the configuration of only one detection signal pin, the forward scan of the scan driving circuit or the backward scan of can be detected. When both the forward scan and the backward scan of the scan driving circuit need to be detected, both a forward scan detection pin and a backward scan detection pin need to be provided. As a result, the number of detection pins disposed in the display panel is increased, and the number of detection pins in a chip used for detection of the display panel is relatively increased. Thus, the cost of the chip is increased, that is, the detection cost is increased when the chip is used to detect the display panel. Therefore, how to detect the forward scan function and the backward scan function of the display panel without increasing the number of the detection pins has become a problem to be solved.

Embodiments of the present application provide a display panel. The display panel includes multiple signal pins, a scan driving circuit, multiple scan signal lines and a first gating circuit. The multiple signal pins include at least a start signal pin and a detection signal pin. The scan driving circuit includes N scan drive units disposed in a cascade manner, and N is a positive integer greater than or equal to 2. Scan signal output terminals of the N scan drive units are electrically connected to the multiple scan signal lines with a one-to-one correspondence. For each of the N scan drive units, a forward scan input terminal of a current-stage scan drive unit is electrically connected to a shift signal output terminal of a previous-stage scan drive unit of the current-stage scan drive unit. A backward scan input terminal of the current-stage scan drive unit is electrically connected to a shift signal output terminal of a next-stage scan drive unit of the current-stage scan drive unit. A forward scan input terminal of a first-stage scan drive unit and a backward scan input terminal of an Nth-stage scan drive unit are both electrically connected to the start signal pin, where the current-stage scan drive unit is not the first-stage scan drive unit and not the Nth-stage scan drive unit. The first gating circuit includes a first switch unit and a second switch unit. An input terminal of the first switch unit is electrically connected to a scan signal detection terminal of the Nth-stage scan drive unit. An input terminal of the second switch unit is electrically connected to a scan signal detection terminal of the first-stage scan drive unit. An output terminal of the first switch unit and an output terminal of the second switch unit are both electrically connected to the detection signal pin. The first switch unit is configured to turn on in a forward scan detection stage and turn off in a backward scan detection stage. The second switch unit is configured to turn on in the backward scan detection stage and turn off in the forward scan detection stage. The scan signal detection terminal of the Nth-stage scan drive unit is a shift signal of the Nth-stage scan drive unit output terminal or a scan signal output terminal of the Nth-stage scan drive unit, and the scan signal detection terminal of the first-stage scan drive unit is a shift signal output terminal of the first-stage scan drive unit or a scan signal output terminal of the first-stage scan drive unit.

With the preceding embodiments adopted, when the forward scan function of the scan driving circuit is detected, the first switch unit is controlled to turn on, and the forward scan detection signal output from the Nth-stage scan drive unit is received through the detection signal pin; when the backward scan function of the scan driving circuit is detected, the second switch unit is controlled to turn on, and the backward scan detection signal output from the first-stage scan drive unit is received through the detection signal pin. In this manner, the forward scan function and the backward scan function of the scan driving circuit having a bidirectional scan function can be detected. Moreover, with the configuration of the first gating circuit, the same detection signal pin can be used for receiving the forward scan detection signal and the backward scan detection signal so that the number of detection signal pins disposed in the display panel can be reduced, which helps to simplify the structure of the display panel and lower the cost of the display panel.

The embodiments of the present application are described in conjunction with the drawings in the embodiments of the present application.

FIG. 1 is a diagram illustrating the structure of a display panel according to embodiments of the present application. As shown in FIG. 1, the display panel 100 includes signal pins 30. Signal pins 30 can be electrically connected to signal terminals in the chip (not shown) with a one-to-one correspondence, where the chip is used for driving or detecting the display panel 100. Signal pins 30 include at least a start signal pin 31 and a detection signal pin 32. The start signal pin 31 can receive a start signal supplied by the chip.

A scan driving circuit 10 and scan signal lines 20 are disposed in the display panel 100. The scan driving circuit 10 includes N scan drive units (ASG1, ASG2, ASG3, ASGn-1, ASGn) disposed in a cascade manner, and N is a positive integer greater than or equal to 2. Scan signal output terminals OUT of the N scan drive units (ASG1, ASG2, ASG3, ASGn-1, ASGn) are electrically connected to scan signal lines 20 with a one-to-one correspondence. A forward scan input terminal IN1 of a first-stage scan drive unit ASG1 is electrically connected to the start signal pin 31. A forward scan input terminal IN1 of each stage of scan drive unit (ASG2, ASG3, . . . , ASGn-1, ASGn) from a second-stage scan drive unit ASG2 to an Nth-stage scan drive unit ASGn is electrically connected to a shift signal output terminal Next of a previous-stage scan drive unit (ASG1, ASG2, ASG3, ASGn-1) of the each stage of scan drive unit. A backward scan input terminal IN2 of the Nth-stage scan drive unit ASGn is electrically connected to the start signal pin 31. A backward scan input terminal IN2 of each stage of scan drive unit (ASGn-1, . . . , ASG3, ASG2, ASG1) from an N-1th-stage scan drive unit ASGn-1 to the first-stage scan drive unit ASG1 is electrically connected to a shift signal output terminal Next of a next-stage scan drive unit (ASGn, ASGn-1, ASG3, ASG2) of the each stage of scan drive unit.

When the scan driving circuit 10 performs the forward scan, the first-stage scan drive unit ASG1 can generate a scan signal Gout1 and a shift signal Vnext1 according to a start signal of the start signal pin 31, output the scan signal Gout1 to one scan signal line 20 corresponding to the first-stage scan drive unit ASG1 through the scan signal output terminal OUT of the first-stage scan drive unit ASG1 and output the shift signal Vnext1 to the second-stage scan drive unit ASG2 through the shift signal output terminal Next of the first-stage scan drive unit ASG1. The second-stage scan drive unit ASG2 generates a scan signal Gout2 and a shift signal Vnext 2 according to the shift signal Vnext1 of the first-stage scan drive unit ASG1, outputs the scan signal Gout2 to one scan signal line 20 corresponding to the second-stage scan drive unit ASG2 through the scan signal output terminal OUT of the second-stage scan drive unit ASG2 and outputs the shift signal Vnext2 to a third-stage scan drive unit ASG3 through the shift signal output terminal Next of the second-stage scan drive unit ASG2. In this manner, the Nth-stage scan drive unit ASGn generates a scan signal Goutn and a shift signal Vnextn according to a shift signal Vnextn-1 of the N-1th-stage scan drive unit ASGn-1 and outputs the scan signal Goutn to one scan signal line 20 corresponding to the Nth-stage scan drive unit ASGn through the scan signal output terminal OUT of the Nth-stage scan drive unit ASGn.

When the scan driving circuit 10 performs the backward scan, the Nth-stage scan drive unit ASGn may generate the scan signal Goutn and the shift signal Vnextn according to a start signal of the start signal pin 31, output the scan signal Goutn to the scan signal line 20 corresponding to the Nth-stage scan drive unit ASGn through the scan signal output terminal OUT of the Nth-stage scan drive unit ASGn and output the shift signal Vnextn to the N-1th-stage scan drive unit ASGn-1 through the shift signal output terminal Next of the Nth-stage scan drive unit ASGn. In this manner, the second-stage scan drive unit ASG2 generates the scan signal Gout2 and the shift signal Vnext2 according to a shift signal Vnext3 of the third-stage scan drive unit ASG3, outputs the scan signal Gout2 to the scan signal line 20 corresponding to the second-stage scan drive unit ASG2 through the scan signal output terminal OUT of the second-stage scan drive unit ASG2 and outputs the shift signal Vnext2 to the first-stage scan drive unit ASG1 through the shift signal output terminal Next of the second-stage scan drive unit ASG2. The first-stage scan drive unit ASG1 generates the scan signal Gout1 and the shift signal Vnext1 according to the shift signal Vnext2 of the second-stage scan drive unit ASG2 and outputs the scan signal Gout1 to the scan signal line 20 corresponding to the first-stage scan drive unit ASG1 through the scan signal output terminal OUT of the first-stage scan drive unit ASG1.

When the forward scan is performed, the multi-stage scan drive units from the second-stage scan drive unit to the Nth-stage scan drive unit successively generate corresponding scan signals and shift signals; and among the multi-stage scan drive units, each stage of scan drive unit generates a scan signal and a shift signal according to a shift signal of the previous-stage scan drive unit of the each stage of scan drive unit. Therefore, a failure in any one of the multi-stage scan drive units in the scan driving circuit affects generation of the scan signal and the shift signal by the Nth-stage scan drive unit. Moreover, when the backward scan is performed, each stage of scan drive unit from the N-1th-stage scan drive unit to the first-stage scan drive unit may generate a scan signal and a shift signal according to a shift signal of the next-stage scan drive unit of the each stage of scan drive unit. Therefore, a failure in any one of the multi-stage scan drive units in the scan driving circuit affects generation of the scan signal and the shift signal by the first-stage scan drive unit.

With continued reference to FIG. 1, a first gating circuit 40 is further disposed in the display panel 100, the first gating circuit 40 includes a first switch unit 41 and a second switch unit 42; an input terminal of the first switch unit 41 is electrically connected to a scan signal detection terminal of the Nth-stage scan drive unit ASGn; an input terminal of the second switch unit 42 is electrically connected to a scan signal detection terminal of the first-stage scan drive unit ASG1; an output terminal of the first switch unit 41 and an output terminal of the second switch unit 42 are both electrically connected to the detection signal pin 32. In this case, in a forward scan detection stage, the first switch unit 41 is controlled to turn on, and the second switch unit 42 is controlled to turn off, so that the forward scan detection signal VtestF output from the Nth-stage scan drive unit is transmitted to the detection signal pin 32 through the turned-on first switch unit 41; in the backward scan detection stage, the first switch unit 41 is controlled to turn off, and the second switch unit 42 is controlled to turn on, so that the backward scan detection signal VtestB output from the first-stage scan drive unit is transmitted to the detection signal pin 32 through the turned-on second switch unit 42. The scan signal detection terminal of the Nth-stage scan drive unit ASGn may serve as the shift signal output terminal Next of the Nth-stage scan drive unit ASGn, and the scan signal detection terminal of the first-stage scan drive unit ASG1 may serve as the shift signal output terminal Next of the first-stage scan drive unit ASG1.

In this manner, a start signal is supplied to a first-stage shift register unit through the start signal pin, a shift signal output from a shift signal output terminal of an Nth-stage shift register unit serves as a forward scan detection signal, and the forward scan detection signal is received through the detection signal and the turned-on first switch unit, so that the forward scan function of the scan driving circuit can be detected according to the forward scan detection signal. Correspondingly, a start signal is supplied to the Nth-stage shift register unit through the start signal pin, a shift signal output from a shift signal output terminal of the first-stage shift register unit serves as a backward scan detection signal, and the backward scan detection signal is received through the detection signal pin and the turned-on second switch unit, so that the backward scan function of the scan driving circuit can be detected according to the backward scan detection signal. In this manner, the same detection signal pin can be used for detecting the forward scan function and the backward scan function of the display panel so that the number of signal pins disposed in the display panel can be reduced, and the number of signal terminals in the chip electrically connected to the signal pins of the display panel is relatively reduced. Since the more signal terminals in the chip, the higher cost of the chip, the cost of the chip used in the display panel can be lowered, and the cost of the display panel using the chip can be lowered.

FIG. 1 is only an exemplary drawing according to embodiments of the present application. FIG. 1 only exemplarily illustrates that the shift signal output terminal Next of the Nth-stage scan drive unit ASGn serves as the scan signal detection terminal of the Nth-stage scan drive unit ASGn and that the shift signal output terminal Next of the first-stage scan drive unit ASG1 serves as the scan signal detection terminal of the first-stage scan drive unit ASG1. In the embodiment of the present application, the scan signal output terminal OUT of the Nth-stage scan drive unit ASGn may further serve as the scan signal detection terminal of the Nth-stage scan drive unit; similarly, the scan signal output terminal OUT of the first-stage scan drive unit ASG1 may serve as the scan signal detection terminal of the first-stage scan drive unit ASG1.

Figure 2:
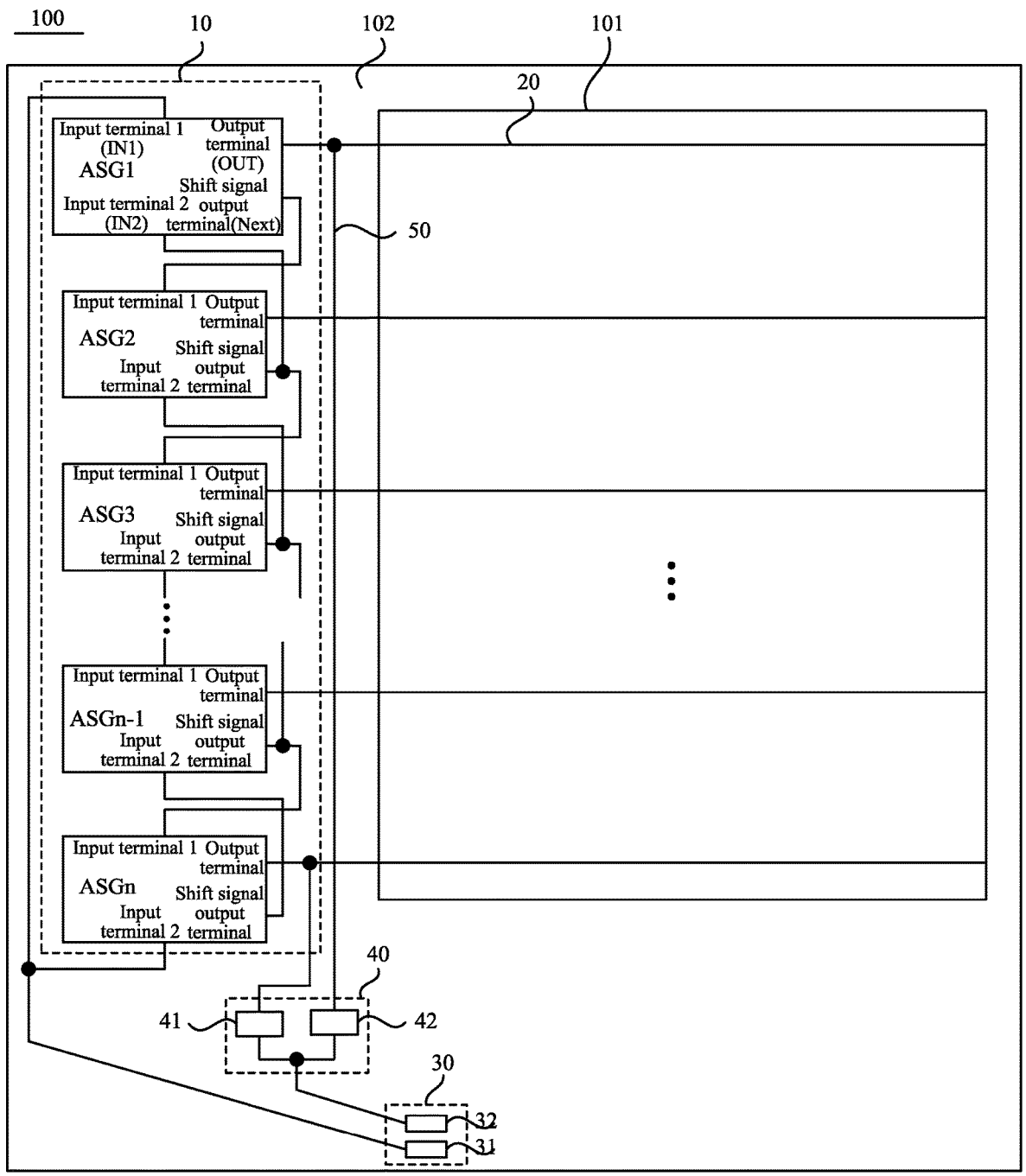
FIG. 2 is a diagram illustrating the structure of another display panel according to embodiments of the present application.

Exemplarily, FIG. 2 is a diagram illustrating the structure of another display panel according to embodiments of the present application. As shown in FIG. 2, the input terminal of the first switch unit 41 of the first gating circuit 40 is electrically connected to the scan signal output terminal OUT of the Nth-stage scan drive unit ASGn, that is, the scan signal output terminal OUT of the Nth-stage scan drive unit ASGn serves as the scan signal detection terminal of the Nth-stage scan drive unit ASGn, so that the scan signal Goutn output from the scan signal output terminal OUT of the Nth-stage scan drive unit ASGn serves as the forward scan detection signal VtestF to detect the forward scan function of the scan driving unit 10. The input terminal of the second switch unit 42 of the first gating circuit 40 is electrically connected to the scan signal output terminal OUT of the first-stage scan drive unit ASG1, that is, the scan signal output terminal OUT of the first-stage scan drive unit ASG1 serves as the scan signal detection terminal of the first-stage scan drive unit ASG1, so that the scan signal Gout1 output from the scan signal output terminal OUT of the first-stage scan drive unit ASG1 serves as the backward scan detection signal VtestB to detect the backward scan function of the scan driving circuit 10. In this manner, the same detection signal pin can be used for receiving the forward scan detection signal and the backward scan detection signal in a time-division manner on the premise that the forward scan function and the backward scan function of the scan driving circuit in the display panel are detected so that the number of signal pins disposed in the display panel can be reduced, and the cost of the display panel can be lowered.

For ease of description, unless otherwise limited, the embodiments of the present application are described using the example in which the shift signal output terminal of the Nth-stage scan drive unit serves as the scan signal detection terminal of the Nth-stage scan drive unit, and the shift signal output terminal of the first-stage scan drive unit serves as the scan signal detection terminal of the first-stage scan drive unit.

FIG. 1 only exemplarily illustrates that the scan driving circuit 10 is disposed in the non-display region 102 located on one side of the display region 101 of the display panel 100. In the embodiment of the present application, the scan driving circuit of the display panel may be further disposed on opposite sides of the display panel. This is not limited in the embodiment of the present application.

Figure 3:
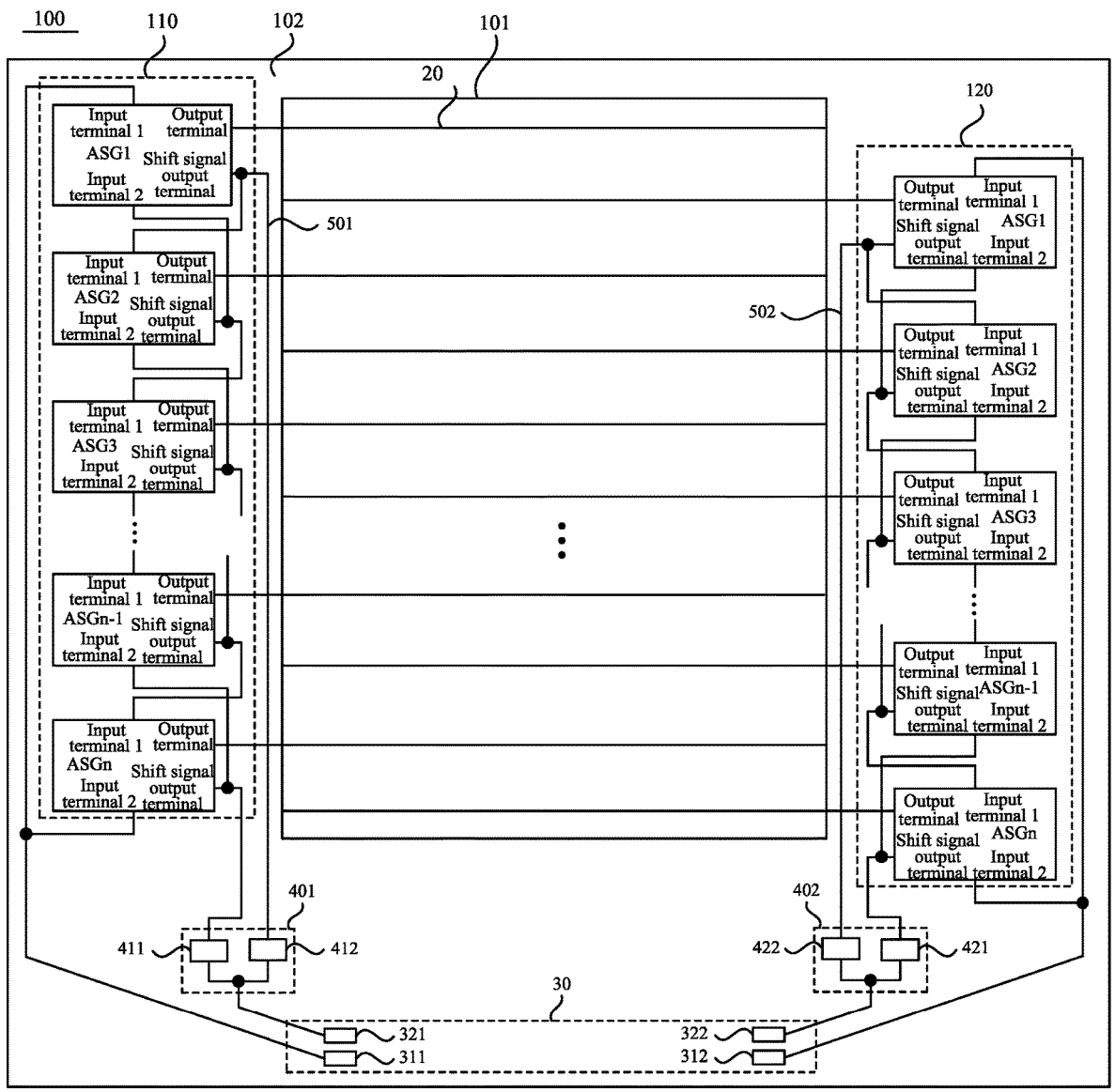
FIG. 3 is a diagram illustrating the structure of another display panel according to embodiments of the present application.

Exemplarily, FIG. 3 is a diagram illustrating the structure of another display panel according to embodiments of the present application. As shown in FIG. 3, the scan driving circuit of the display panel 100 includes a first scan driving circuit 110 and a second scan driving circuit 120. The first scan driving circuit 110 and the second driving circuit 120 are disposed on opposite sides of the display region 101. In this case, two start signal pins 311 and 312 may be included in signal pins. In the first scan driving circuit 110, a forward scan input terminal IN1 of a first-stage scan drive unit ASG1 and a backward scan input terminal IN2 of an Nth-stage scan drive unit ASGn are both electrically connected to the start signal pin 311. In the second scan driving circuit 120, a forward scan input terminal IN1 of a first-stage scan drive unit ASG1 and a backward scan input terminal IN2 of an Nth-stage scan drive unit ASGn are both electrically connected to the start signal pin 312.

Two first gating circuits 401 and 402 may be disposed in the display panel 100, and two detection signal pins 321 and 322 may be included in signal pins. In this case, in the first gating circuit 401, an input terminal of a first switch unit 411 is electrically connected to a scan signal detection terminal of the Nth-stage scan drive unit ASGn of the first scan driving circuit 110, an input terminal of a second switch unit 412 is electrically connected to a scan signal detection terminal of the first-stage scan drive unit ASG1 of the first scan driving circuit 110, and an output terminal of the first switch unit 411 and an output terminal of the second switch unit 412 are both electrically connected to the detection signal pin 321; in the first gating circuit 402, an input terminal of a first switch unit 421 is electrically connected to a scan signal detection terminal of the Nth-stage scan drive unit ASGn of the second scan driving circuit 120, an input terminal of a second switch unit 422 is electrically connected to a scan signal detection terminal of the first-stage scan drive unit ASG1 of the second scan driving circuit 120, and an output terminal of the first switch unit 421 and an output terminal of the second switch unit 422 are both electrically connected to the detection signal pin 322. In this manner, the detection signal pin 321 is used for receiving the forward scan detection signal and the backward scan detection signal of the first scan driving circuit 110 in a time-division manner, and the detection signal pin 322 is used for receiving the forward scan detection signal and the backward scan detection signal of the second scan driving circuit 120 in a time-division manner. This configuration is conducive to reducing the number of signal pins disposed in the display panel, and the cost of the display panel can be lowered.

For ease of description, the embodiments of the present application is described using the example in which the scan driving circuit of the display panel is disposed on one side of the display region.

The structures of the first switch unit and the second switch unit of the first gating circuit are not limited in the embodiment of the present application on the premise that the first switch unit and the second switch unit of the first gating circuit are turned on in a time-division manner and can transmit the forward scan detection signal and the backward scan detection signal of the scan driving circuit to the detection signal pin respectively.

Figure 4:
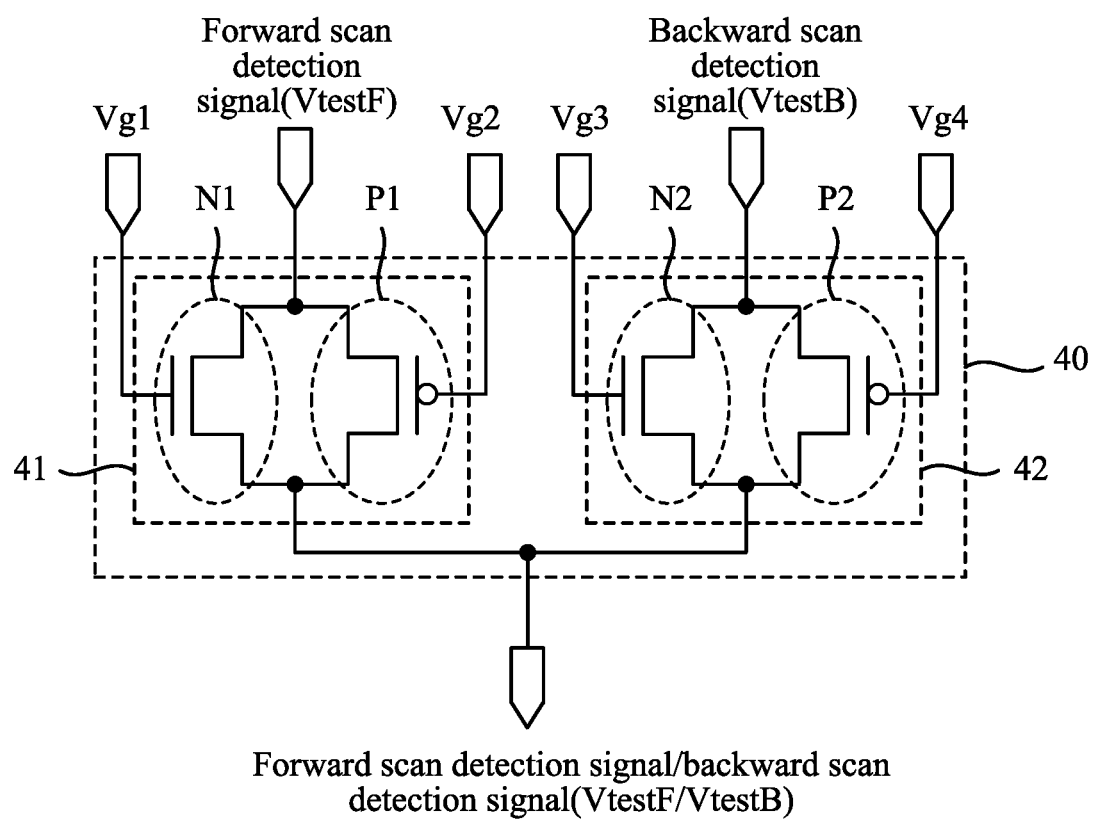
FIG. 4 is a diagram illustrating the structure of a first gating circuit according to embodiments of the present application.

In one embodiment, FIG. 4 is a diagram illustrating the structure of a first gating circuit according to embodiments of the present application. As shown in FIG. 4, the first switch unit 41 of the first gating circuit 40 includes a first transmission gate, the first transmission gate includes a first n-type transistor N1 and a first p-type transistor P1; a first electrode of the first n-type transistor N1 and a first electrode of the first p-type transistor P1 are both the input terminal of the first switch unit 41; a second electrode of the first n-type transistor N1 and a second electrode of the first p-type transistor P1 are both the output terminal of the first switch unit 41; a gate of the first n-type transistor N1 is configured to receive a first control signal Vg1, and a gate of the first p-type transistor P1 is configured to receive a second control signal Vg2. The second switch unit 42 of the first gating circuit 40 includes a second transmission gate, the second transmission gate includes a second n-type transistor N2 and a second p-type transistor P2; a first electrode of the second n-type transistor N2 and a first electrode of the second p-type transistor P2 are both the input terminal of the second switch unit 42; a second electrode of the second n-type transistor N2 and a second electrode of the second p-type transistor P2 are both the output terminal of the second switch unit 42; a gate of the second n-type transistor N2 is configured to receive a third control signal Vg3, and a gate of the second p-type transistor P2 is configured to receive a fourth control signal Vg4.

In the forward scan detection stage, the first control signal Vg1 is configured to control the first n-type transistor N1 to turn on, and the second control signal Vg2 is configured to control the first p-type transistor P1 to turn on, so that the forward scan detection signal VtestF output from the Nth-stage scan drive unit can be transmitted to the detection signal pin through the first n-type transistor N1 and the first p-type transistor P1 of the first transmission gate. In this manner, the loss of the forward scan detection signal VtestF transmitted to the detection signal pin can be reduced, which helps to improve the accuracy of the forward scan function of the scan driving circuit when the forward scan function of the scan driving circuit is detected. Correspondingly, in the backward scan detection stage, the third control signal Vg3 is configured to control the second n-type transistor N2 to turn on, and the fourth control signal Vg4 is configured to control the second p-type transistor P2 to turn on, so that the backward scan detection signal VtestB output from the first-stage scan drive unit can be transmitted to the detection signal pin through the second n-type transistor N2 and the second p-type transistor P2 of the second transmission gate. In this manner, the loss of the backward scan detection signal VtestB transmitted to the detection signal pin can be reduced, which helps to improve the accuracy of the backward scan function of the scan driving circuit when the backward scan function of the scan driving circuit is detected.

In one embodiment, the first control signal Vg1 may also serves as the fourth control signal Vg4, and the second control signal Vg2 may also serve as the third control signal Vg3. The n-type transistor is turned on at a high level and turned off at a low level, and the p-type transistor is turned on at a low level and turned off at a high level, so when the first control signal Vg1 is at a high level, and the second control signal Vg2 is at a low level, the first n-type transistor N1 and the first p-type transistor P1 may be controlled to turn on, and the second n-type transistor N2 and the second p-type transistor P2 may be controlled to turn off; when the first control signal Vg1 is at a low level, and the second control signal Vg2 is at a high level, the second n-type transistor N2 and the second p-type transistor P2 may be controlled to turn on, and the first n-type transistor N1 and the first p-type transistor P1 may be controlled to turn off. In this manner, when the first control signal Vg1 also serves as the fourth control signal Vg4, and the second control signal Vg2 also serves as the third control signal Vg3, the first transmission gate and the second transmission gate can be turned on in a time-division manner. Moreover, the number of control signals provided can be reduced, the number of signal pins disposed in the display panel for supplying control signals can be reduced, the structure of the display panel can be simplified and the cost of the display panel can be lowered.

Figure 5:
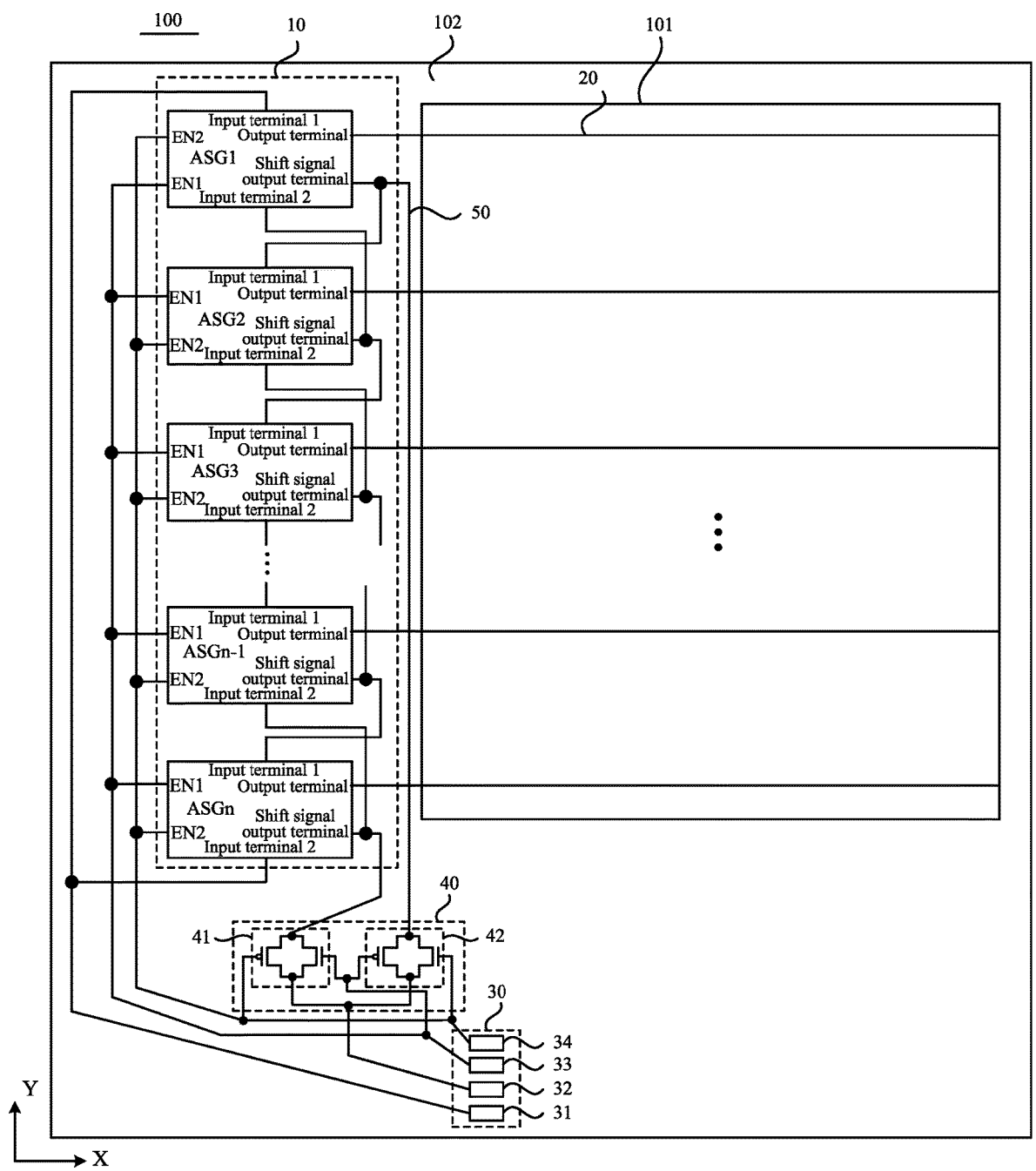
FIG. 5 is a diagram illustrating the structure of another display panel according to embodiments of the present application.

In one embodiment, FIG. 5 is a diagram illustrating the structure of another display panel according to embodiments of the present application. As shown in FIGS. 4 and 5, signal pins 30 in the display panel 100 may further include a forward enable signal pin 33 and a backward enable signal pin 34; forward scan enable terminals EN1 of the multi-stage scan drive units (ASG1, ASG2, ASG3, ASGn−1, ASGn) are all electrically connected to the forward enable signal pin 33, and backward scan enable terminals EN2 of the multi-stage scan drive units (ASG1, ASG2, ASG3, ASGn−1, ASGn) are all electrically connected to the backward enable signal pin 34. In this case, the gate of the first n-type transistor N1 and the gate of the second p-type transistor P2 may be both electrically connected to the forward enable signal pin 33, and the gate of the second n-type transistor N2 and the gate of the first p-type transistor P1 are both electrically connected to the backward enable signal pin 34.

When the scan driving circuit 10 performs the forward scan, a forward enable signal U2D of the forward enable signal pin 33 is supplied to the forward scan enable terminals EN1 of the multi-stage scan drive units (ASG1, ASG2, ASG3, ASGn−1, ASGn) so that the multi-stage scan drive units (ASG1, ASG2, ASG3, ASGn−1, ASGn) perform the forward scan process; when the scan driving circuit 10 performs the backward scan, a backward enable signal D2U of the backward enable signal pin 34 is supplied to the backward scan enable terminals EN2 of the multi-stage scan drive units (ASG1, ASG2, ASG3, . . . , ASGn−1, ASGn) so that the multi-stage scan drive units (ASG1, ASG2, ASG3, . . . , ASGn−1, ASGn) perform the backward scan process.

Figure 6:
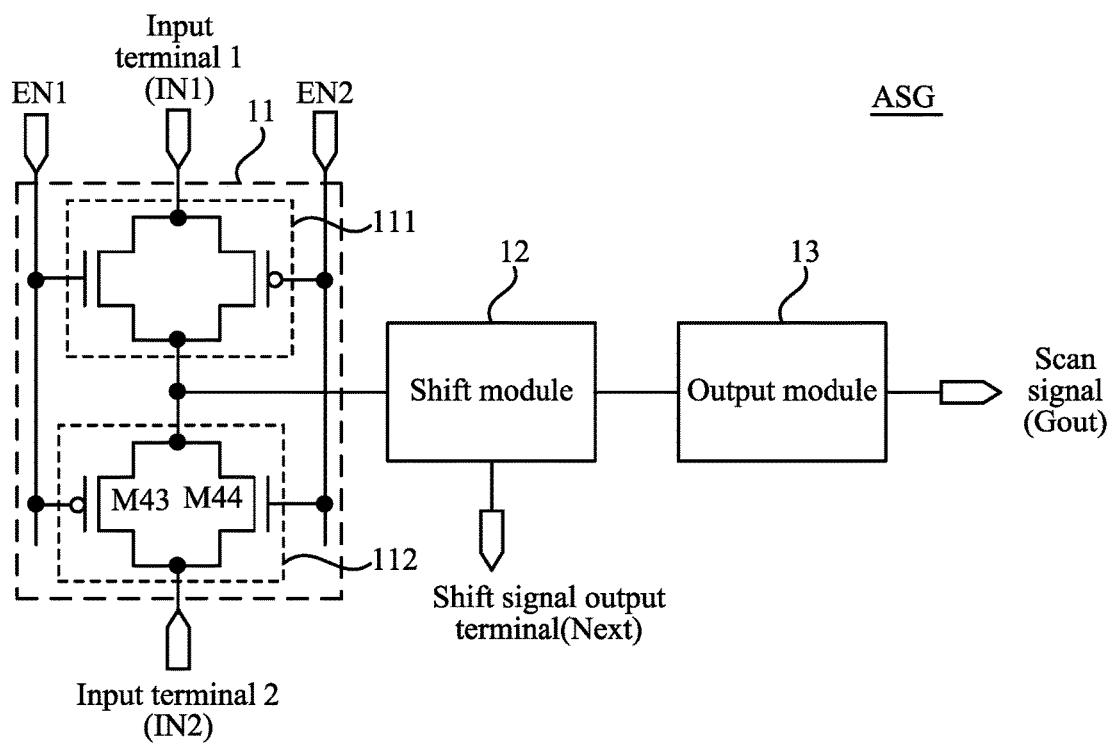
FIG. 6 is a diagram illustrating the structure of a scan drive unit according to embodiments of the present application.

Exemplarily, FIG. 6 is a diagram illustrating the structure of a scan drive unit according to embodiments of the present application. As shown in FIGS. 5 and 6, each scan drive unit ASG may include an input module 11, a shift module 12 and an output module 13. The input module 11 may include two transmission gates 111 and 112. Each of the two transmission gates (111 and 112) may be composed of an n-type transistor and a p-type transistor. When the scan driving circuit 10 performs the forward scan, the forward enable signal U2D of the forward scan enable terminal EN1 and the backward enable signal D2U of the backward scan enable terminal EN2 may be configured to control both the n-type transistor and the p-type transistor of the transmission gate 111 to turn on so that a signal of the forward scan input terminal IN1 is transmitted to the shift module 12, and the shift module 12 latches the signal, and so that a shift signal is output to the forward scan input terminal IN1 of the next-stage scan drive unit of the each scan drive unit ASG though the shift signal output terminal Next of the each scan drive unit ASG and so that a scan signal is controlled to generate by the output module 13 at the same time and output to the corresponding scan signal line 20 through the scan signal output terminal OUT of the each scan drive unit ASG.

Referring to FIGS. 4 to 6, when the forward scan detection of the scan driving circuit 10 is performed, the multi-stage scan drive units ASG of the scan driving circuit 10 need to perform the forward scan process and receive the forward scan detection signal output from the Nth-stage scan drive unit ASGn through the detection signal pin 32 and the turned-on first switch unit 41 successively; when the backward scan detection of the scan driving circuit 10 is performed, the multi-stage scan drive units ASG of the scan driving circuit 10 need to perform the backward scan process and receive the backward scan detection signal output from the first-stage scan drive unit ASG1 though the detection signal pin 32 and the turned-on second switch unit 42 in sequence. Therefore, in the first switch unit 41 of the first gating circuit 40, the gate of the first n-type transistor N1 may receive the same control signal as the gate of the n-type transistor of the transmission gate 111 of the input module 11 of the each scan drive unit ASG, and the gate of the first p-type transistor P1 may receive the same control signal as the gate of the p-type transistor of the transmission gate 111 of the input module 11 of the each scan drive unit ASG. And in the second switch unit 42 of the first gating circuit 40, the gate of the second n-type transistor N2 may receive the same control signal as the gate of the n-type transistor of the transmission gate 112 of the input module 11 of the each scan drive unit ASG, and the gate of the second p-type transistor P2 may receive the same control signal as the gate of the p-type transistor of the transmission gate 112 of the input module 11 of the each scan drive unit ASG.

In this manner, the first n-type transistor, the second p-type transistor of the first gating circuit 40, the n-type transistor of the transmission gate 111 and the p-type transistor of the transmission gate 112 of the input module 11 of the each scan drive unit ASG are all electrically connected to the same forward enable signal pin 33 to be controlled to turn on or turn off by the forward enable signal U2D of the forward enable signal pin 33. And the first p-type transistor P1, the second n-type transistor N2 of the first gating circuit 40, the p-type transistor of the transmission gate 111 and the n-type transistor of the transmission gate 112 of the input module 11 of the each scan drive unit ASG are all electrically connected to the same backward enable signal pin 34 to be controlled to turn on or turn off by the backward enable signal D2U of the backward enable signal pin 34. In this manner, the number of signal pins disposed in the display panel can be reduced, the structure of the display panel can be simplified and the cost of the display panel can be lowered.

Figure 7:
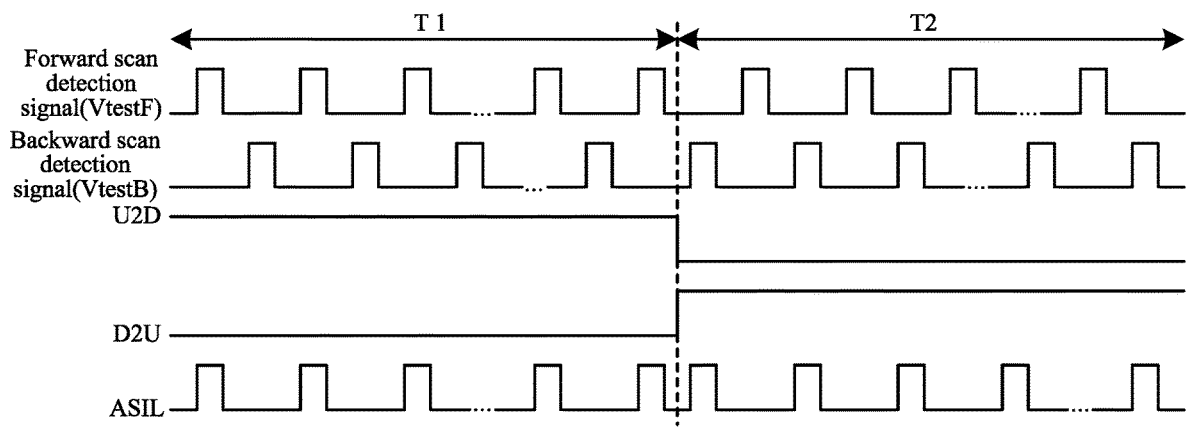
FIG. 7 is a detection timing diagram of a scan driving circuit according to embodiments of the present application.

FIG. 7 is a detection timing diagram of a scan driving circuit according to embodiments of the present application. Referring to FIGS. 4, 5 and 7, in the forward scan detection stage T1 of the scan driving circuit 10, a high-level forward enable signal U2D supplied by the forward enable signal pin 33 is configured to control the first n-type transistor N1 to turn on and the second p-type transistor P2 to turn off, a low-level backward enable signal D2U supplied by the backward enable signal pin 34 is configured to control the first p-type transistor P1 to turn on and the second n-type transistor N2 to turn off, and the multi-stage scan drive units ASG perform the forward scan process and receive the forward scan detection signal VtestF output from the Nth-stage scan drive unit ASGn through the detection signal pin 32, the turned-on first n-type transistor N1 and the turned-on first p-type transistor P1 successively; in the backward scan detection stage T2 of the scan driving circuit 10, a low-level forward enable signal U2D supplied by the forward enable signal pin 33 is configured to control the first n-type transistor N1 to turn off and the second p-type transistor P2 to turn on, a high-level backward enable signal D2U supplied by the backward enable signal pin 34 is configured to control the first p-type transistor P1 to turn off and the second n-type transistor N2 to turn on, and the multi-stage scan drive units ASG perform the backward scan process and receive the backward scan detection signal VtestB output from the first-stage scan drive unit ASG1 through the detection signal pin 32, the turned-on second n-type transistor N2 and the turned-on second p-type transistor P2 successively. In this manner, the forward scan function and the backward scan function of the scan driving circuit 10 can be detected according to a scan detection signal ASIL received.

FIG. 6 is only an exemplary drawing according to embodiments of the present application. FIG. 6 exemplarily illustrates the structural composition of a scan drive unit ASG. The structure of the scan drive unit is not limited in the embodiment of the present application on the premise that the forward scan function and the backward scan function can be implemented by the multi-stage scan drive units of the scan driving circuit.

With continued reference to FIG. 5, the display panel 100 further includes a backward scan detection signal transmission line 50; the extension direction Y of the backward scan detection signal transmission line 50 intersects the extension direction X of scan signal lines 20; the input terminal of the second switch unit 42 is electrically connected to the scan signal detection terminal of the first-stage scan drive unit ASG1 through the backward scan detection signal transmission line 50. In this manner, in the backward scan detection stage, the backward scan detection signal output from the first-stage scan drive unit ASG1 can be transmitted to the detection signal pin 32 through the backward scan detection signal transmission line 50 and the turned-on second switch unit 42 successively to detect the backward scan function of the scan driving circuit of the display panel.

Figure 8:
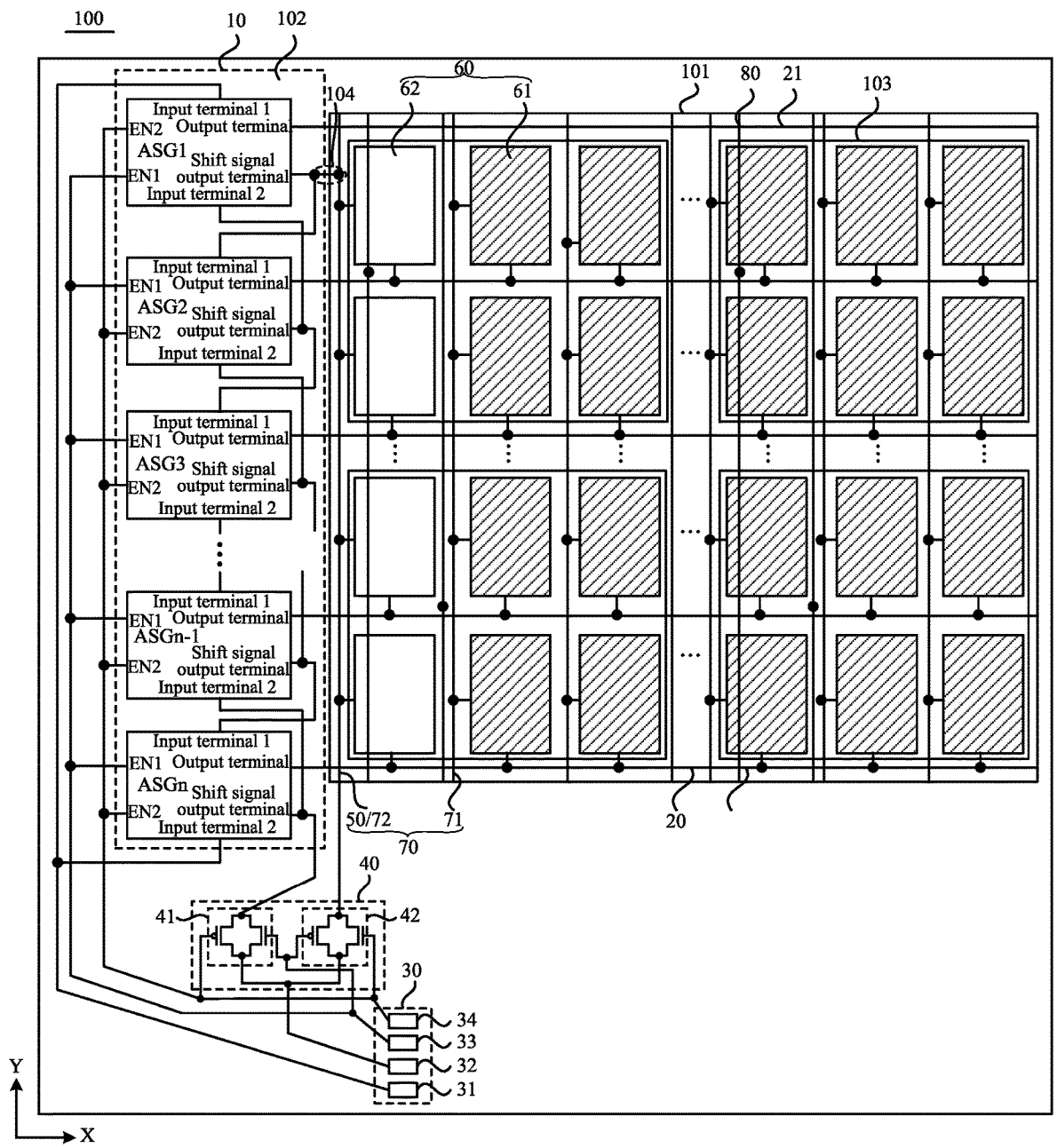
FIG. 8 is a diagram illustrating the structure of another display panel according to embodiments of the present application.

In one embodiment, FIG. 8 is a diagram illustrating the structure of another display panel according to embodiments of the present application. As shown in FIG. 8, sub-pixels 60 arranged in an array, data signal lines 70 and signal wires 80 are disposed in the display panel; a same row of sub-pixels 60 are electrically connected to a same one of scan signal lines 20 so that scan signals output from the multi-stage scan drive units (ASG1, ASG2, ASG3, ASGn−1, ASGn) of the scan driving circuit 10 can be transmitted to sub-pixels 60 with a one-to-one correspondence by scan signal lines 20; a same column of sub-pixels 60 are electrically connected to a same one of data signal lines 70 so that data signals can be supplied to sub-pixels 60 with a one-to-one correspondence by data signal lines 70 when the corresponding raw of ones of sub-pixels 60 receive effective scan signals and so that the each of sub-pixels 60 can perform display according to the corresponding data signals; the extension direction Y of each of signal wires 80 intersects the extension direction X of scan signal lines 20. The each of signal wires 80 is another signal line different from the each of scan signal lines 20 and each of data signal lines 70, for example, a touch wire of the display panel 100 used for transmitting a touch signal to a touch electrode 103 or receiving a touch signal generated by the touch electrode 103.

Sub-pixels 60 include display sub-pixels 61 and non-display sub-pixels 62 located at at least one side of display sub-pixels 61. In this case, along data signal lines 70, a data signal line 70 electrically connected to one same column of non-display sub-pixels 62 of non-display sub-pixels 62 may be a virtual data signal line 72 to transmit a corresponding data signal to the corresponding one same column of the non-display sub-pixels 62 of non-display sub-pixels 62, and a data signal line 71 electrically connected to one same column of ones of display sub-pixels 61 transmits a corresponding data signal to the corresponding one same column of ones of display sub-pixels 61. Since when the display panel 100 displays an image, display sub-pixels 61 emit light for display, but non-display sub-pixels 62 do not emit light for display, at least one virtual data signal line 72 may also serve as the backward scan detection signal transmission line 50 so that the at least one virtual data signal line 72 can be used for directly transmitting the backward scan detection signal output from the first-stage scan drive unit ASG1 on the premise that the display panel 100 can normally display. In this manner, the number of signal lines disposed in the display panel 100 can be reduced, and the structure of the display panel 100 can be simplified.

FIG. 8 is only an exemplary drawing according to embodiments of the present application. FIG. 8 exemplarily illustrates that the at least one virtual data signal line 72 also serves as the backward scan detection signal transmission line 50. Other existing signal lines may also serve as the backward scan detection signal transmission line 50 on the premise that the display panel can normally display.

Figure 9:
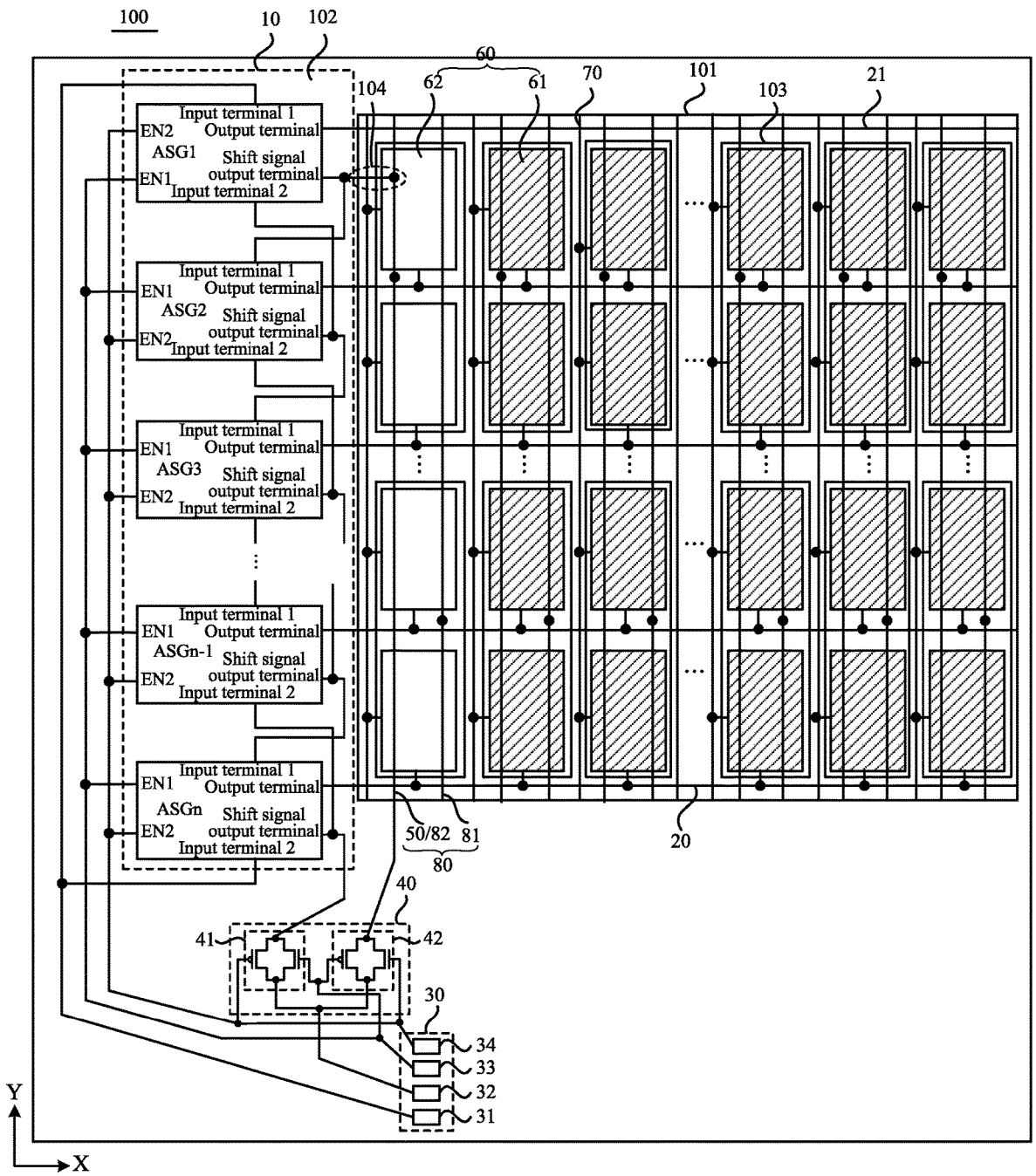
FIG. 9 is a diagram illustrating the structure of another display panel according to embodiments of the present application.

Exemplarily, FIG. 9 is a diagram illustrating the structure of another display panel according to embodiments of the present application. As shown in FIG. 9, when the structure (such as the touch electrode 103) electrically connected to at least one of signal wires 80 does not affect the normal functions of the display panel 100, the at least one of signal wires 80 may be a virtual signal wire 82, and at least one virtual signal wire 82 also serves as the backward scan detection signal transmission line 50. In this manner, the number of signal lines disposed in the display panel 100 can also be reduced, and the structure of the display panel 100 can be simplified.

The shift signal output terminal Next of the first-stage scan drive unit ASG1 serves as the scan signal detection terminal of the first-stage scan drive unit ASG1 in FIGS. 8 and 9. In the embodiment of the present application, the scan signal detection terminal of the first-stage scan drive unit may further serve as the scan signal output terminal of the first-stage scan drive unit.

Figure 10:
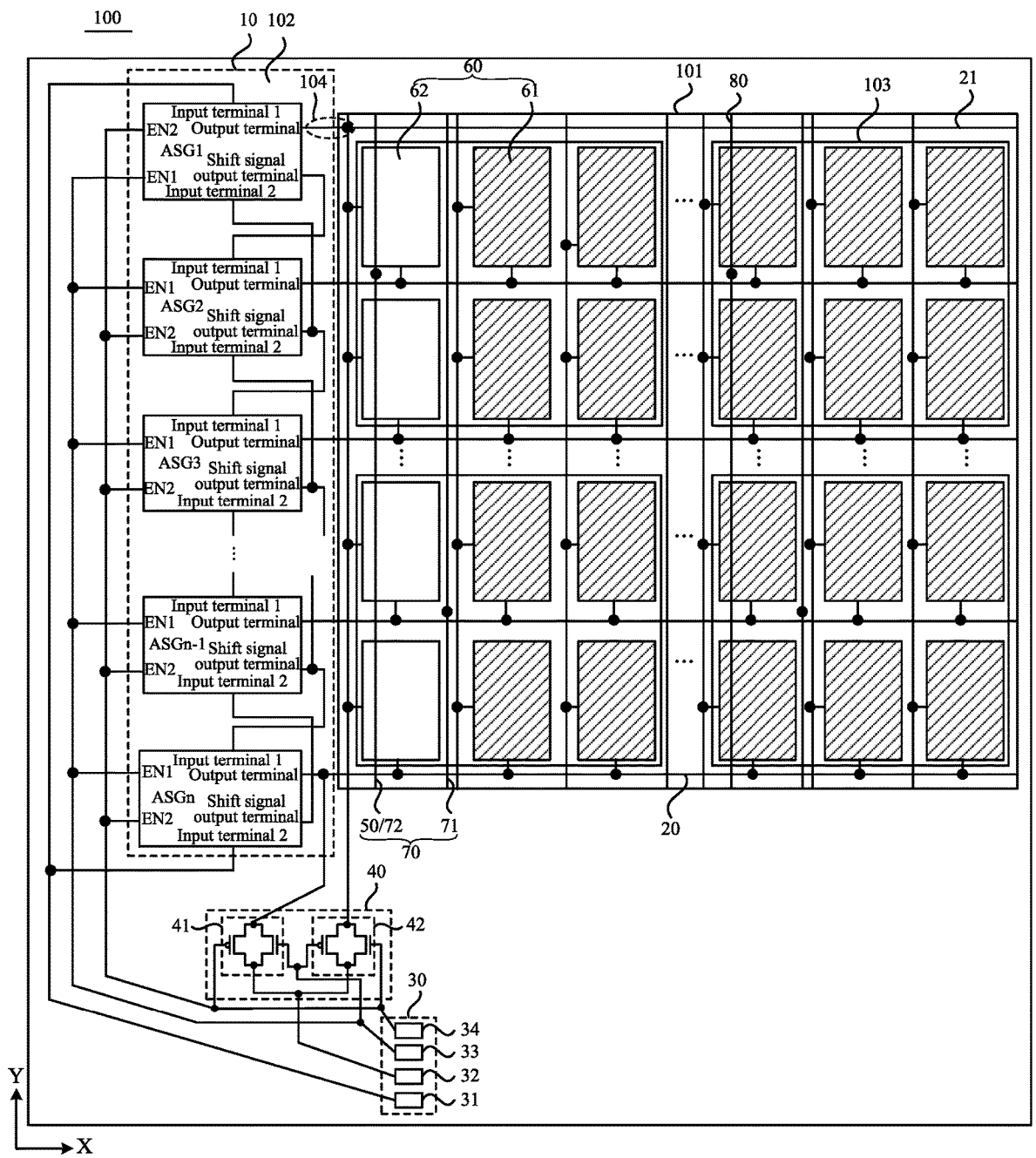
FIG. 10 is a diagram illustrating the structure of another display panel according to embodiments of the present application.

Exemplarily, as shown in FIG. 10, when the at least one virtual data signal line 72 also serves as the backward scan detection signal transmission line 50, and the scan signal output terminal OUT of the first-stage scan drive unit ASG1 serves as the scan signal detection terminal of the first-stage scan drive unit ASG1, the at least one virtual data signal line 72 may be electrically connected to the scan signal output terminal OUT of the first-stage scan drive unit ASG1 and the input terminal of the second switch unit 42.

Figure 11:
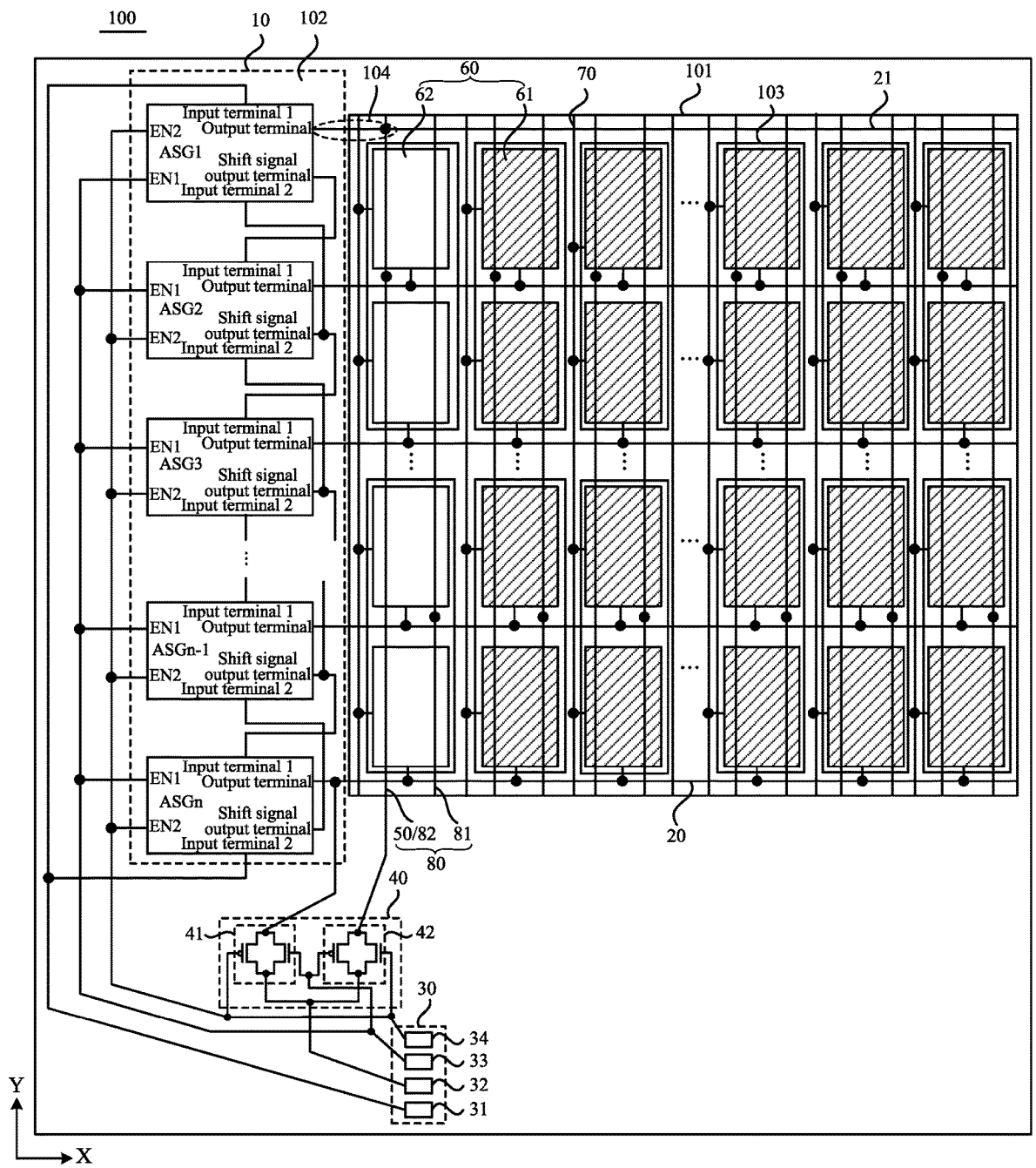
FIG. 11 is a diagram illustrating the structure of another display panel according to embodiments of the present application.

As shown in FIG. 11, when the at least one virtual signal wire 82 also serves as the backward scan detection signal transmission line 50, and the scan signal output terminal OUT of the first-stage scan drive unit ASG1 serves as the scan signal detection terminal of the first-stage scan drive unit ASG1, the at least one virtual signal wire 82 may be electrically connected to the scan signal output terminal OUT of the first-stage scan drive unit ASG1 and the input terminal of the second switch unit 42.

Unless otherwise described, the embodiment of the present application are described using the example in which at least one virtual data signal line also serves as the backward scan detection signal transmission line. Additionally, the embodiment of the present application is described using the preceding exemplary example in which signal wires are touch wires. Signal wires may further be power signal lines used for supplying power signals to sub-pixels in the embodiment of the present application. The type of signal wires is not limited in the embodiment of the present embodiment.

Figure 12:
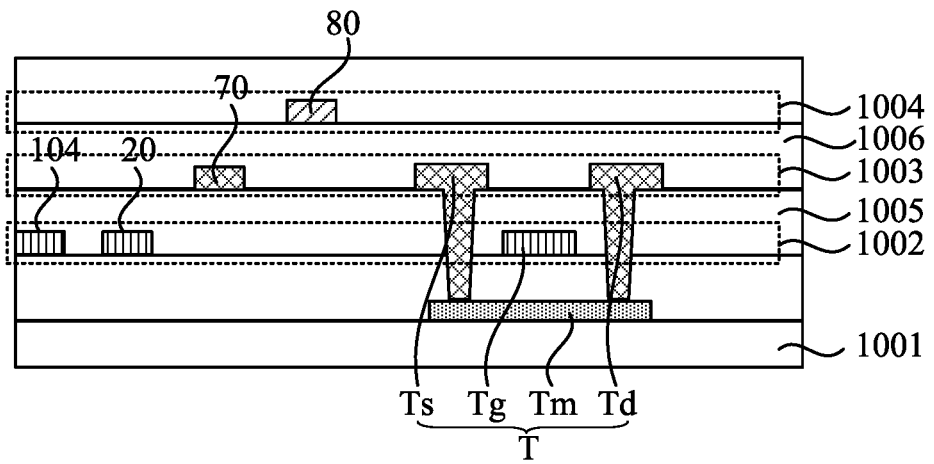
FIG. 12 is a diagram illustrating the film structure of a display panel according to embodiments of the present application.

In one embodiment, FIG. 12 is a diagram illustrating the film structure of a display panel according to embodiments of the present application. As shown in FIG. 12, the display panel includes a base substrate 1001, a first metal layer 1002, a second metal layer 1003 and a third metal layer 1004. The first metal layer 1002, the second metal layer 1003 and the third metal layer 1004 are located on one side of the base substrate 1001 and insultatively spaced apart. The first metal layer 1002 includes scan signal lines 20. The second metal layer 1003 includes data signal lines 70. The third metal layer 1004 includes signal wires 80. In this manner, scan signal lines 20, data signal lines 70 and signal wires 80 are disposed in different metal layers, and a corresponding insulation layer is disposed between any two adjacent metal layers. For example, an insulation layer 1005 is disposed between the first metal layer 1002 and the second metal layer 1003, and an insulation layer 1006 is disposed between the second metal layer 1003 and the third metal layer 1004 to prevent signal lines in metal layers from disturbing each other when signals are transmitted.

Additionally, a switch transistor T may further be included in each of sub-pixels in the display panel. The switch transistor T includes an active layer Tm, a gate Tg, a source Ts and a drain Td. In this case, in the each of sub-pixels, the gate Tg of the switch transistor T may be in the same metal layer as scan signal lines 20, and the source Ts and the drain Td of the switch transistor T may be in the same metal layer as data signal lines 70.

In one embodiment, with continued reference to FIG. 8, the display panel 100 further includes a first connection line 104; the extension direction of the first connection line 104 intersects the extension direction of the backward scan detection signal transmission line 50; a first terminal of the first connection line 104 is electrically connected to the input terminal of the second switch unit 42 through the backward scan detection signal transmission line 50; a second terminal of the first connection line 104 is electrically connected to the scan signal detection terminal of the first-stage scan drive unit ASG1. In this manner, the backward scan detection signal output from the scan signal detection terminal of the first-stage scan drive unit ASG1 can be transmitted to the detection signal pin 32 through the first connection line 104, the backward scan detection signal transmission line 50 and the turned-on second switch unit 42 successively to detect the backward scan function of the scan driving circuit 10 of the display panel 100 according to the backward scan detection signal received by the detection signal pin 32.

In one embodiment, as shown in FIGS. 8 and 12, the first connection line 104 may be in the same layer as scan signal lines 20. At the time, since the extension direction X of scan signal lines 20 and the extension direction X of the first connection line 104 intersect the extension direction Y of each of data signal lines 70, the extension direction X of the first connection line 104 may parallel to the extension direction X of data signal lines 70. In this manner, on the premise that scan signal lines 20 normally output scan signals, the configuration in which the first connection line 104 is in the same layer as scan signal lines 20 can simplify the film layer of the display panel, and help to make the display panel lighter and thinner.

Figure 13:
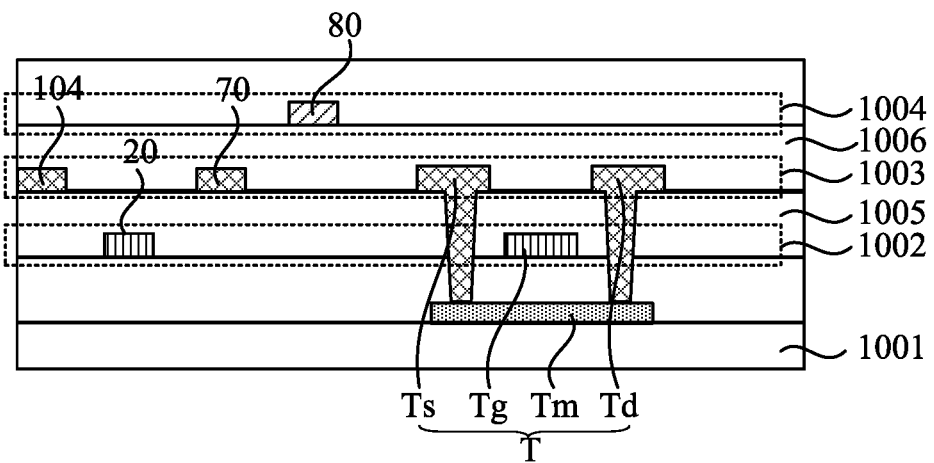
FIG. 13 is a diagram illustrating the film structure of another display panel according to embodiments of the present application.
Figure 14:
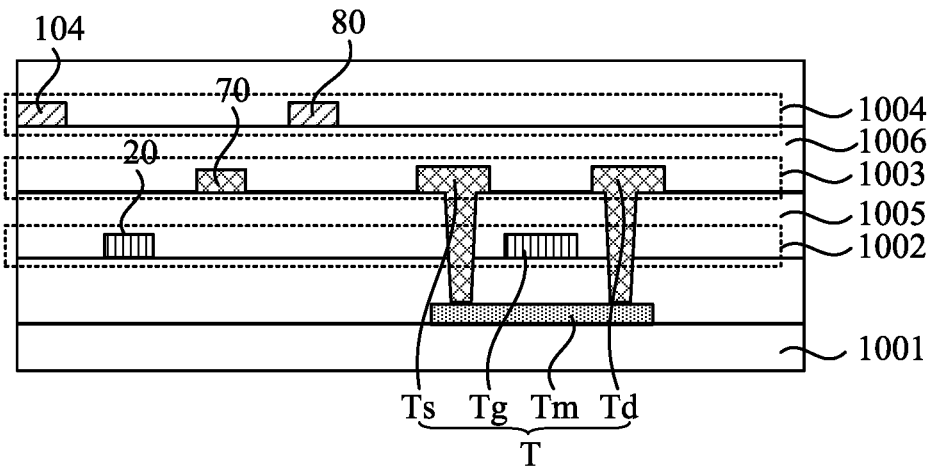
FIG. 14 is a diagram illustrating the film structure of another display panel according to embodiments of the present application.

FIG. 12 is only an exemplary drawing according to embodiments of the present application. FIG. 12 only exemplarily illustrates that the first connection line 104 is in the same layer as scan signal lines 20. In the embodiment of the present application, the first connection line 104 may be further in the same layer as data signal lines 70 (as shown in FIG. 13), or the first connection line 104 is in the same layer as signal wires 80 (as shown in FIG. 14). In the embodiment of the present application, the first connection line 104 may be disposed with the existing film layer having a lower impendence as far as possible to ensure the accuracy of the backward scan detection signal transmitted by the first connection line 104.

In one embodiment, with continued reference to FIG. 10, among scan signal lines 20, a scan signal line 20 electrically connected to the scan signal output terminal OUT of the first-stage scan drive unit ASG1 of the scan driving circuit 100 is a virtual scan signal line 21. The virtual scan signal line 21 is electrically connected to none of display sub-pixels 61. When the scan signal detection terminal of the first-stage scan drive unit ASG1 is the scan signal output terminal OUT of the first-stage scan drive unit ASG1, at least part of the virtual scan signal line 21 also serves as the first connection line 104. In this manner, on the premise that the display panel 100 can normally display, the at least part of the virtual scan signal line 21 also serves as the first connection line 104 so that the number of signal lines disposed in the display panel can be reduced, and the structure of the display panel 100 can be simplified.

Figure 15:
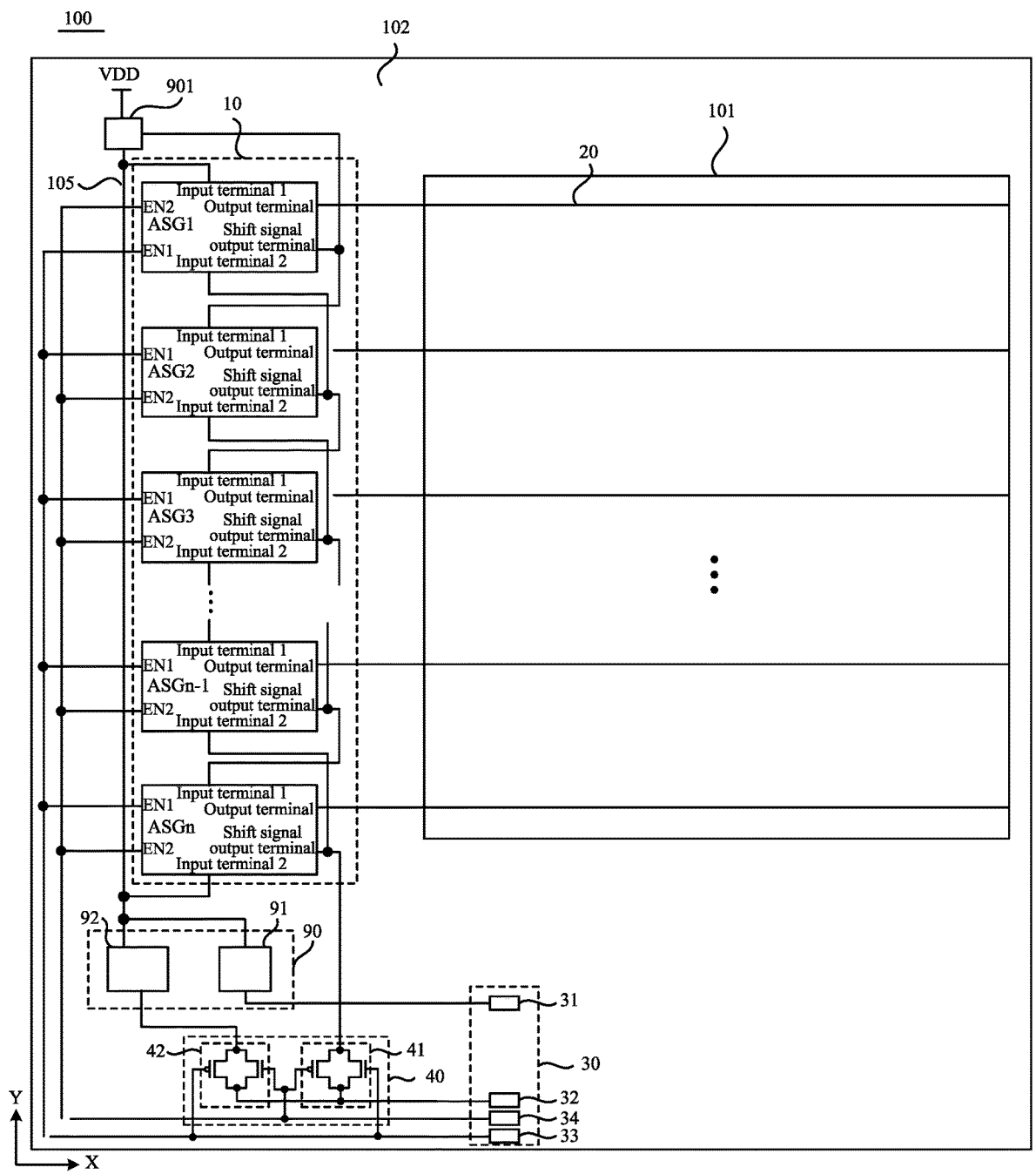
FIG. 15 is a diagram illustrating the structure of another display panel according to embodiments of the present application.

In one embodiment, FIG. 15 is a diagram illustrating the structure of another display panel according to embodiments of the present application. As shown in FIG. 15, a start signal transmission line 105 is further disposed in the display panel 100, a first terminal of the start signal transmission line 105 is electrically connected to the backward scan input terminal IN2 of the Nth-stage scan drive unit ASGn, and a second terminal of the start signal transmission line 105 is electrically connected to the forward scan input terminal IN1 of the first-stage scan drive unit ASG1; the start signal transmission line 105 is configured to transmit a start signal of the start signal pin 31 to the forward scan input terminal IN1 of the first-stage scan drive unit ASG1 and the backward scan input terminal IN2 of the Nth-stage scan drive unit ASGn.

With continued reference to FIG. 15, a second gating circuit 90 and a switch module 901 are further disposed in the display panel 100. The second gating circuit 90 includes a third switch unit 91 and a fourth switch unit 92; the first terminal of the start signal transmission line 105 is electrically connected to an output terminal of the third switch unit 91 and an input terminal of the fourth switch unit 92, and the second terminal of the start signal transmission line 105 is further electrically connected to an output terminal of the switch unit 901; an input terminal of the third switch unit 91 is electrically connected to the start signal pin 31; an output terminal of the fourth switch unit 92 is electrically connected to the input terminal of the second switch unit 42; the third switch unit 91 is configured to turn on when an effective pulse of a start signal is supplied by the start signal pin 31; the fourth switch unit 92 is configured to turn on when the backward scan detection signal is output; an input terminal of the switch module 901 is configured to receive a fixed voltage signal VDD; a control terminal of the switch module 901 is electrically connected to the scan signal detection terminal of the first-stage scan drive unit ASG1; the switch module 901 is configured to output the backward scan detection signal according to a signal of the scan signal detection terminal of the first-stage scan drive unit ASG1 in the backward scan detection stage.

In the forward scan detection stage of the scan driving circuit 10, the third switch unit 91 of the second gating circuit 90 may be controlled to turn on so that a start signal supplied by the start signal pin 31 can be transmitted to the start signal transmission line 105 through the turned-on third switch unit 91 and then to the forward scan input terminal IN1 of the first-stage scan drive unit ASG1 through the start signal transmission line 105. In this manner, the multi-stage scan drive units from the first-stage scan drive unit ASG1 to the Nth-stage scan drive unit ASGn can successively generate shift signals and scan signals. Moreover, the first switch unit 41 of the first gating circuit 40 is controlled to turn on so that the forward scan detection signal output from the Nth-stage scan drive unit ASGn can be transmitted to the detection signal pin 32 through the turned-on first switch unit 41.

In the backward scan detection stage of the scan driving circuit 10, the third switch unit 91 of the second gating circuit 90 may be controlled to turn on in the duration from the start moment to the stop moment of an effective pulse of a start signal of the start signal pin 31 so that the effective pulse of the start signal of the start signal pin 31 can be transmitted to the start signal transmission line 105 through the turned-on third switch unit 91 and then to the backward scan input terminal IN2 of the Nth-stage scan drive unit ASGn through the start signal transmission line 105. In this manner, the multi-stage scan drive units from the Nth-stage scan drive unit ASGn to the first-stage scan drive unit ASG1 can successively generate shift signals and scan signals. Moreover, after the effective pulse of the start signal is stopped and before the first-stage scan drive unit ASG1 outputs a shift signal and/or a scan signal, the fourth switch unit 92 of the second gating circuit 90 and the second switch unit 42 of the first gating circuit 40 are controlled to turn on, and the third switch unit 91 of the second gating circuit 90 and the first switch unit 41 of the first gating circuit 40 are controlled to turn off, so that the backward scan detection signal is output to the start signal transmission line 105 by the switch module 901 according to a signal of the scan signal detection terminal of the first-stage scan drive unit ASG1, then to the input terminal of the fourth switch unit 92 through the start signal transmission line 105 and to the detection signal pin 32 through the turned-on fourth switch unit 92 and the turned-on second switch unit 42 in sequence.

In this manner, with the configuration of the second gating circuit 90 and the switch module 901, the forward scan function and the backward scan function of the display panel can be detected. Moreover, the start signal transmission line 105 also serves as the backward scan detection signal transmission line used for transmitting the backward scan detection signal so that the number of signal lines disposed in the display panel can be reduced, and the bezels of the display panel can be narrower and the structure of the display panel can be simplified.

The structures of the third switch unit and the fourth switch unit of the second gating circuit are not limited in the embodiment of the present application on the premise that the third switch unit 91 and the fourth switch unit 92 of the second gating circuit 90 are turned on in a time-division manner, can transmit a start signal supplied by the start signal pin 31 to the start signal transmission line 105 in the forward scan detection stage and the initial stage of the backward scan and transmit the backward scan detection signal transmitted by the start signal transmission line 105 to the detection signal pin in the output stage of the backward scan detection signal.

Figure 16:
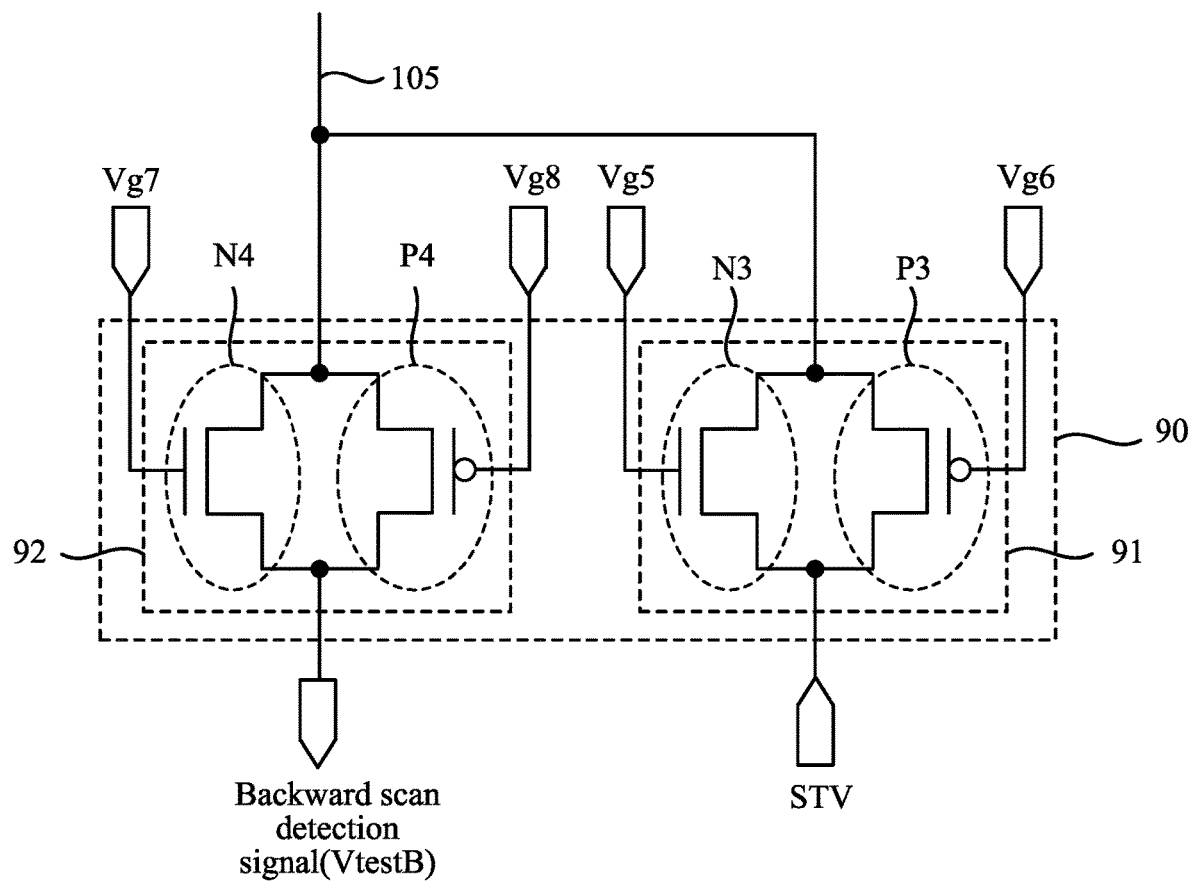
FIG. 16 is a diagram illustrating the structure of a second gating circuit according to embodiments of the present application.

In one embodiment, FIG. 16 is a diagram illustrating the structure of a second gating circuit according to embodiments of the present application. As shown in FIGS. 15 and 16, the third switch unit 91 of the second gating circuit 90 includes a third transmission gate, the third transmission gate includes a third n-type transistor N3 and a third p-type transistor P3; a first electrode of the third n-type transistor N3 and a first electrode of the third p-type transistor P3 are both the input terminal of the third switch unit 91; a second electrode of the third n-type transistor N3 and a second electrode of the third p-type transistor P3 are both the output terminal of the third switch unit 91; a gate of the third n-type transistor N3 is configured to receive a fifth control signal Vg5, and a gate of the third p-type transistor P3 is configured to receive a sixth control signal Vg6. The fourth switch unit 92 of the second gating circuit 90 includes a fourth transmission gate, the fourth transmission gate includes a fourth n-type transistor N4 and a fourth P-type transistor P4; a first electrode of the fourth n-type transistor N4 and a first electrode of the fourth P-type transistor P4 are both the input terminal of the fourth switch unit 92; a second electrode of the fourth n-type transistor N4 and a second electrode of the fourth P-type transistor P4 are both the output terminal of the fourth switch unit 92; a gate of the fourth n-type transistor N4 is configured to receive a seventh control signal Vg7, and a gate of the fourth P-type transistor P4 is configured to receive an eighth control signal Vg8.

In the forward scan detection stage, the fifth control signal Vg5 is configured to control the third n-type transistor N3 to turn on, and the sixth control signal Vg6 is configured to control the third p-type transistor P3 to turn on so that a start signal STV of the start signal pin 31 can be transmitted to the start signal transmission line 105 through the third n-type transistor N3 and the third p-type transistor P3 of the third transmission gate, the loss of the start signal transmitted to the start signal transmission line 105 can be reduced and the first-stage scan drive unit ASG1 can receive the accurate start signal. In this manner, the multi-stage scan drive units from the first-stage scan drive unit ASG1 to the Nth-stage scan drive unit ASGn can successively generate accurate shift signals and scan signals, and the Nth-stage scan drive unit ASGn can output the accurate forward scan detection signal. Consequently, the detection accuracy of the forward scan function can be improved.

In the backward scan detection stage, at least in the duration from the start moment to the stop moment of an effective pulse of the start signal STV, the fifth control signal Vg5 is configured to control the third n-type transistor N3 to turn on, and the sixth control signal Vg6 is configured to control the third p-type transistor P3 to turn on so that the effective pulse of the start signal STV of the start signal pin 31 can be transmitted to the start signal transmission line 105 through the third n-type transistor N3 and the third p-type transistor P3 of the third transmission gate, the loss of the start signal STV transmitted to the start signal transmission line 105 can be reduced and the Nth-stage scan drive unit ASGn can receive the accurate start signal STV. In this manner, the multi-stage scan drive units from the Nth-stage scan drive unit ASGn to the first-stage scan drive unit ASG1 can successively generate accurate shift signals and scan signals. And after the stop moment of the effective pulse of the start signal STV of the start signal pin 31, the seventh control signal Vg7 is configured to control the fourth n-type transistor N4 to turn on, and the eighth control signal Vg8 is configured to control the fourth p-type transistor P4 to turn on so that the backward scan detection signal generated by a shift signal or a scan signal output from the first-stage scan drive unit ASG1 can be transmitted to the second switch unit 42 by the switch module 901 through the start signal transmission line 105 and the fourth n-type transistor N4 and the fourth p-type transistor P4 of the fourth transmission gate. In this manner, on the premise that the start signal transmission line 105 also serves to transmit the backward scan detection signal, the loss of the backward scan detection signal can be reduced, and the detection accuracy of the backward scan function of the scan driving circuit 10 can be improved.

In one embodiment, the fifth control signal Vg5 may also serve as the eighth control signal Vg8, and the sixth control signal Vg6 may also serve as the seven control signal Vg7. The n-type transistor is turned on at a high level and turned off at a low level, and the p-type transistor is turned on at a low level and turned off at a high level, so when the fifth control signal Vg5 is at a high level, and the sixth control signal Vg6 is at a low level, the third n-type transistor N3 and the third P-type transistor P3 may be controlled to turn on, and the fourth N-type transistor N4 and the fourth P-type transistor P4 are controlled to turn off; and when the fifth control signal Vg5 is at a low level, and the sixth control signal Vg6 is at a high level, the fourth n-type transistor N4 and the fourth P-type transistor P4 may be controlled to turn on, and the third n-type transistor N3 and the third p-type transistor P3 may be controlled to turn off. In this manner, when the fifth control signal Vg5 also serves as the eighth control signal Vg8, and the sixth control signal Vg6 also serves as the seventh control signal Vg7, the third transmission gate and the fourth transmission gate can be turned on in a time-division manner. Moreover, with the configuration of the multiplexing of control signals, the number of control signals provided can be reduced, the number of signal pins disposed in the display panel used for supplying control signals can be reduced, and the structure of the display panel and lowering the cost of the display panel can be simplified.

Figure 17:
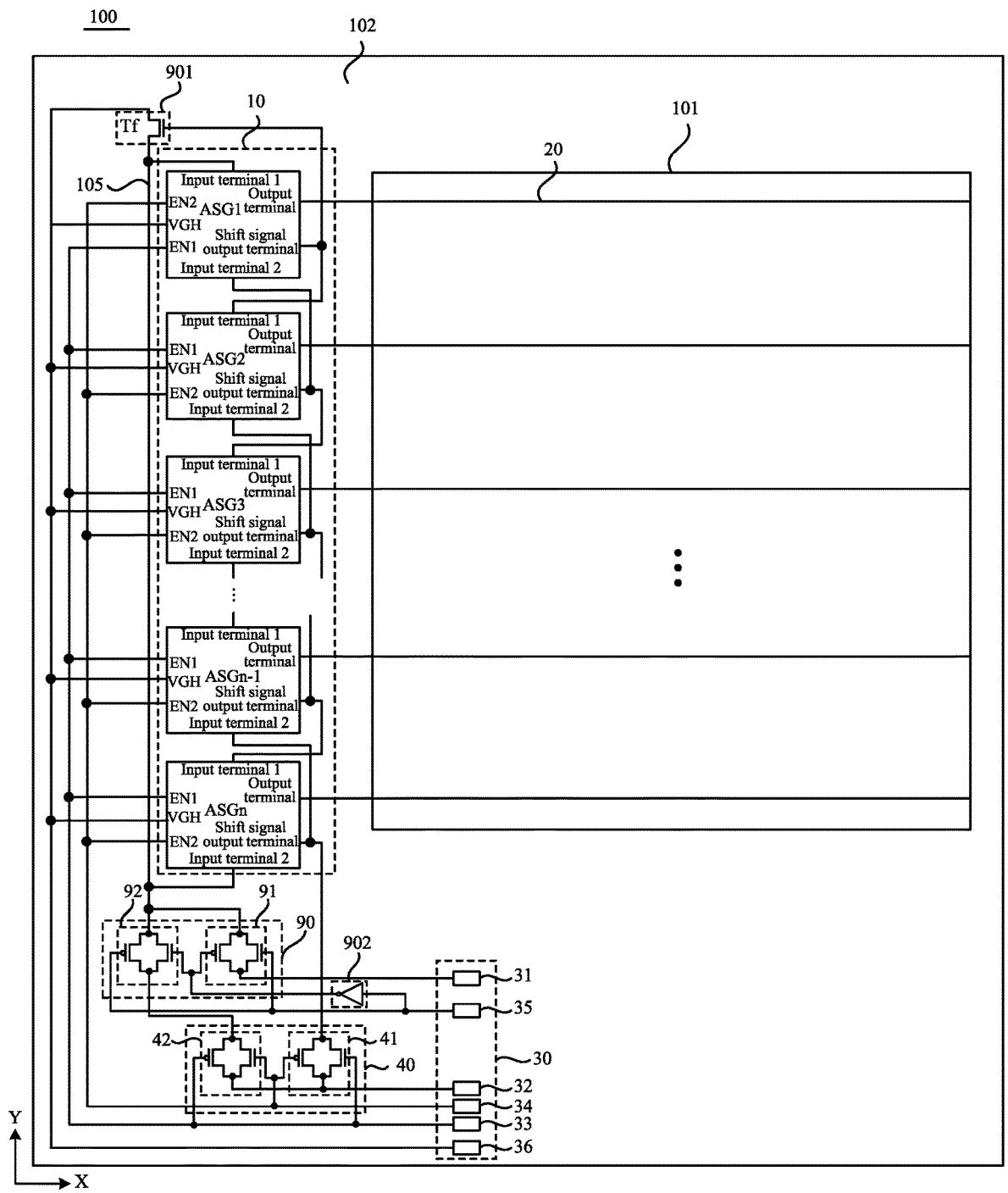
FIG. 17 is a diagram illustrating the structure of another display panel according to embodiments of the present application.

In one embodiment, FIG. 17 is a diagram illustrating the structure of another display panel according to embodiments of the present application. As shown in FIGS. 16 and 17, a phase inverter 902 is further disposed in the display panel 100, and signal pins 30 further include a control signal pin 35; the control signal pin 35 can be configured to supply the fifth control signal Vg5; an input terminal of the phase inverter 902 is electrically connected to the control signal pin 35, and an output terminal of the phase inverter 902 is electrically connected to the gate of the third p-type transistor P3 and the gate of the fourth n-type transistor N4; the gate of the third n-type transistor N3 and the gate of the fourth p-type transistor P4 are electrically connected to the control signal pin 35.

When the control signal pin 35 supplies a high-level fifth control signal Vg5, the fifth control signal Vg5 can be configured to control the third n-type transistor N3 to turn on and the fourth p-type transistor P4 to turn off, and the high-level fifth control signal Vg5 is converted to a low-level control signal through the phase inverter 902 to control the third p-type transistor P3 to turn on and the fourth n-type transistor N4 to turn off so that the start signal STV supplied by the start signal pin 31 can be transmitted to the start signal transmission line 105 through the turned-on third n-type transistor N3 and the turned-on third p-type transistor P3 of the third transmission gate. Moreover, at the time, since the fourth n-type transistor N4 and the fourth p-type transistor P4 of the fourth transmission gate are turned off, a signal on the start signal transmission line 105 cannot be transmitted to the detection signal pin 32 through the fourth transmission gate.

When the control signal pin 35 supplies a low-level fifth control signal Vg5, the fifth control signal Vg5 can be configured to control the third n-type transistor N3 to turn off and the fourth p-type transistor P4 to turn on, and the low-level fifth control signal Vg5 is converted to a high-level control signal through the phase inverter 902 to control the third p-type transistor P3 to turn off and the fourth n-type transistor N4 to turn on so that a signal on the start signal transmission line 105 can be transmitted to the detection signal pin 32 through the turned-on fourth n-type transistor N4 and the turned-on fourth p-type transistor P4 of the fourth transmission gate. Moreover, at the time, since the third n-type transistor N3 and the third p-type transistor P3 of the third transmission gate are turned off, the start signal STV supplied by the start signal pin 31 cannot be transmitted to the start signal transmission line 105 through the third transmission gate.

In this manner, with the configuration of only one control signal pin, the third n-type transistor and the third p-type transistor of the third switch unit of the second gating circuit and the fourth n-type transistor and the fourth p-type transistor of the fourth switch unit of the second gating circuit can be controlled to turn on in a time-division manner so that the number of control signal pins disposed in the display panel can be reduced, the structure of the display panel can be simplified and the cost of the display panel can be lowered.

FIG. 17 is only an exemplary drawing according to embodiments of the present application. FIG. 17 only exemplarily illustrates that the signal supplied by the control signal pin is the fifth control signal. In the embodiment of the present application, the signal supplied by the control signal pin may further be the sixth control signal.

Figure 18:
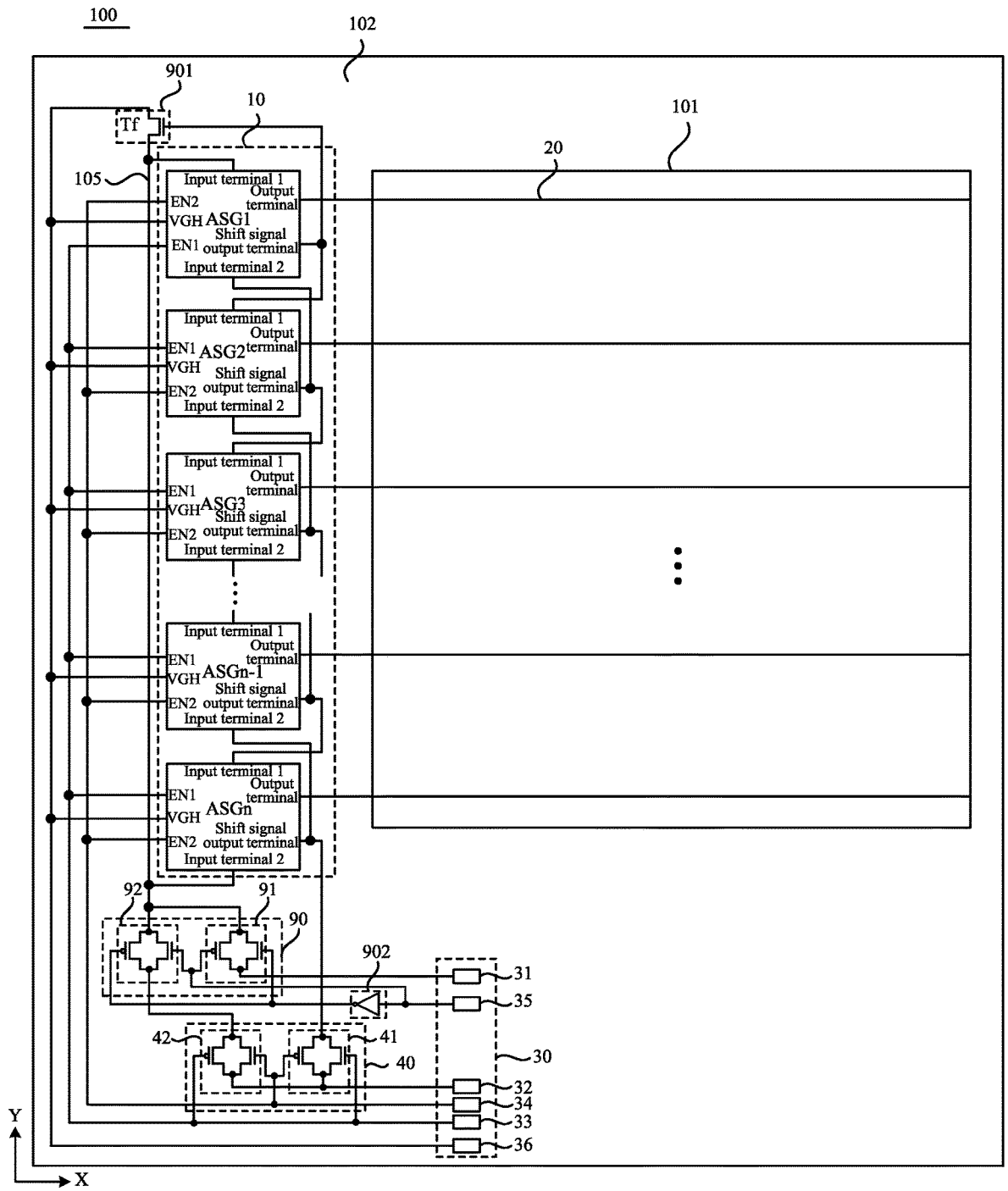
FIG. 18 is a diagram illustrating the structure of another display panel according to embodiments of the present application.

Exemplarily, FIG. 18 is a diagram illustrating the structure of another display panel according to embodiments of the present application. As shown in FIGS. 16 and 18, the input terminal of the phase inverter 902 is electrically connected to the control signal pin 35, the output terminal of the phase inverter 902 is electrically connected to the gate of the third n-type transistor N3 and the gate of the fourth p-type transistor P4; the gate of the third p-type transistor P3 and the gate of the fourth n-type transistor N4 are electrically connected to the control signal pin 35. In this case, the control signal pin 35 is configured to supply the sixth control signal Vg6. When the control signal pin 35 supplies a low-level sixth control signal Vg6, the sixth control signal Vg6 can be configured to control the third p-type transistor P3 to turn on and the fourth n-type transistor N4 to turn off, and the low-level sixth control signal Vg6 is converted to a high-level control signal through the phase inverter 902 to control the third n-type transistor N3 to turn on; when the control signal pin 35 supplies a high-level sixth control signal Vg6, the sixth control signal Vg6 can be configured to control the fourth n-type transistor N4 to turn on and the third p-type transistor P3 to turn off, and the high-level sixth control signal Vg6 is converted to a low-level control signal through the phase inverter 902 to control the third n-type transistor N3 to turn off and the fourth p-type transistor P4 to turn on. In this manner, on the premise that the third n-type transistor and the third p-type transistor of the third switch unit of the second gating circuit and the fourth n-type transistor and the fourth p-type transistor of the fourth switch unit of the second gating circuit can be controlled to turn on in a time-division manner, the number of control signal pins disposed in the display panel can be also reduced, the structure of the display panel can be simplified and the cost of the display panel can be lowered.

Figure 19:
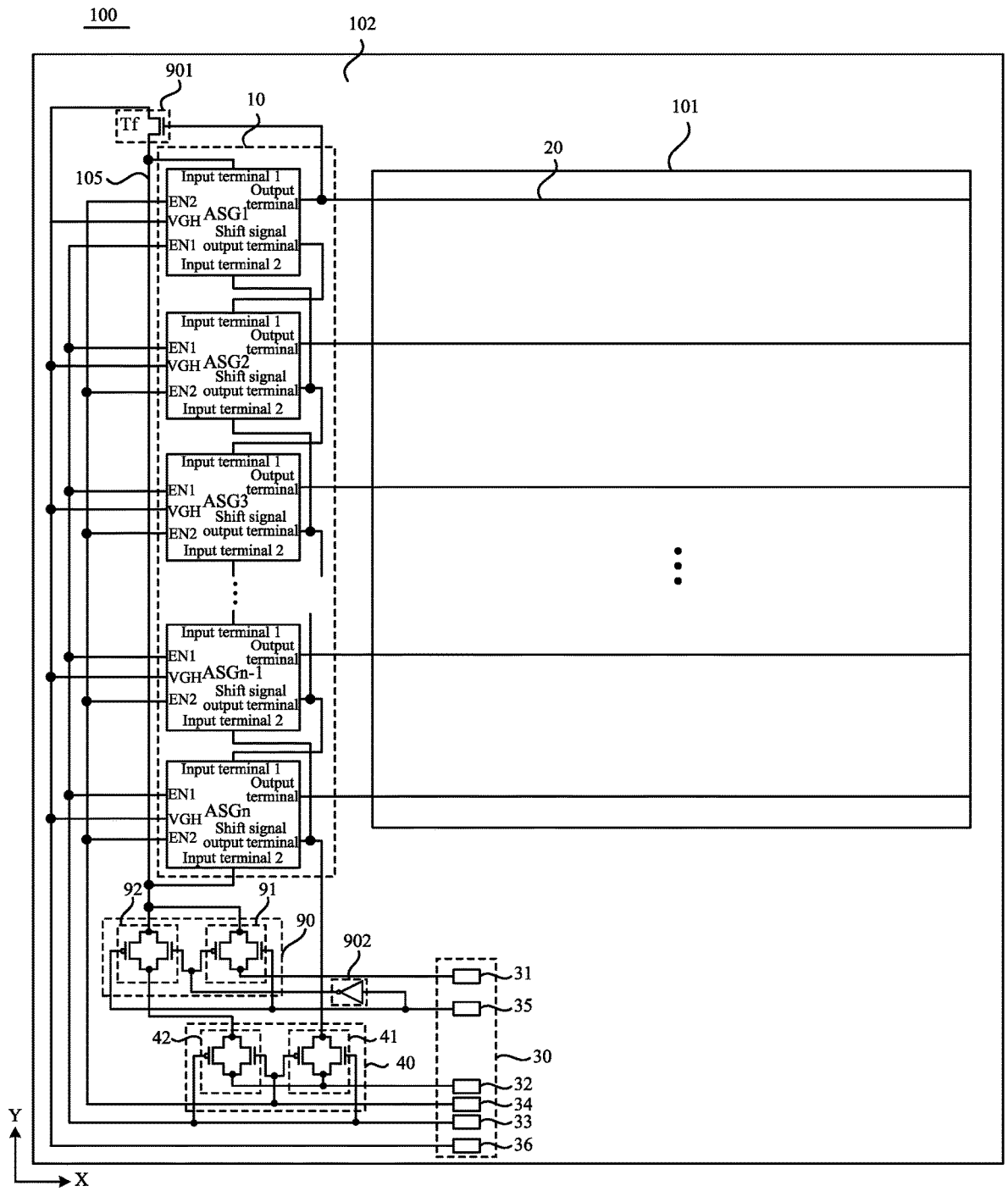
FIG. 19 is a diagram illustrating the structure of another display panel according to embodiments of the present application.
Figure 20:
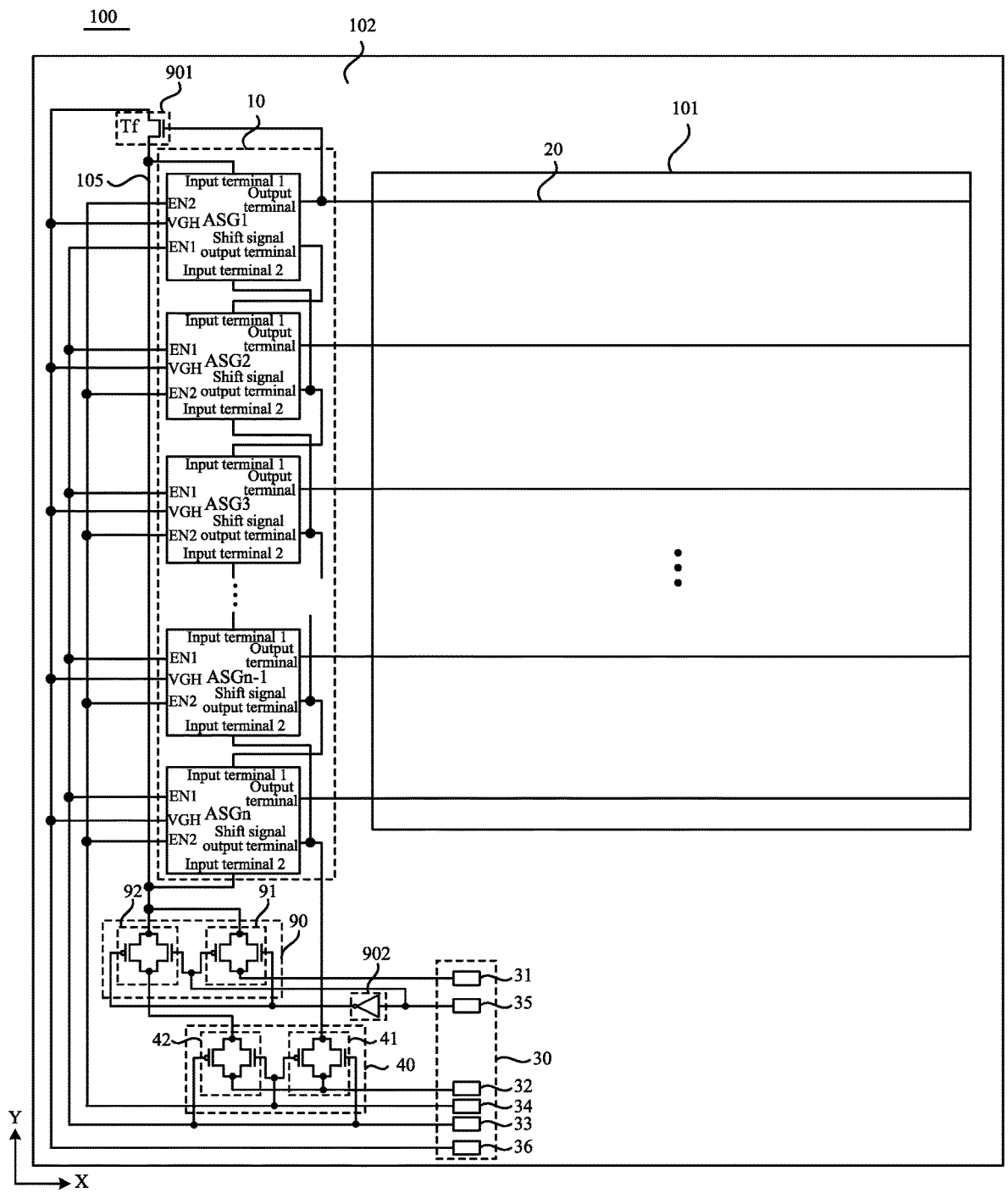
FIG. 20 is a diagram illustrating the structure of another display panel according to embodiments of the present application.

The shift signal output terminal Next of the first-stage scan drive unit ASG1 serves as the scan signal detection terminal of the first-stage scan drive unit ASG1 in FIGS. 17 and 18. In the embodiment of the present application, the scan signal detection terminal of the first-stage scan drive unit ASG1 may further serve as the scan signal output terminal OUT of the first-stage scan drive unit ASG1 as shown in FIGS. 19 and 20. Similar parts can be referred to the preceding descriptions of FIGS. 17 and 18 and are not repeated here.

In one embodiment, with continued reference to FIG. 17, the switch module 901 includes the switch transistor Tf, a gate of the switch transistor Tf serves as the control terminal of the switch module 901, a first electrode of the switch transistor Tf serves as the input terminal of the switch module 901, and a second electrode of the switch transistor Tf serves as the output terminal of the switch module 901.

In the backward scan detection stage, the gate of the switch transistor Tf is configured to receive a signal of the scan detection terminal of the first-stage shift register unit ASG1 so that the backward scan detection signal can be generated by the switch transistor Tf to the start signal transmission line 105 according to the signal received by the gate of the switch transistor Tf and a fixed voltage signal of the first electrode of the switch transistor Tf and transmitted to the detection signal pin 32 by the start signal transmission line 105 through the turned-on fourth switch unit 92 and the turned-on second switch unit 42, and the backward scan function of the scan driving circuit 10 can be detected.

The structure of the switch module shown in FIG. 17 is only an exemplary drawing according to embodiments of the application. The specific structure of the switch module is not limited in the embodiment of the present application on the premise that the switch module can generate the backward scan detection signal according to signals of the control terminal and the input terminal of the switch module.

Figure 21:
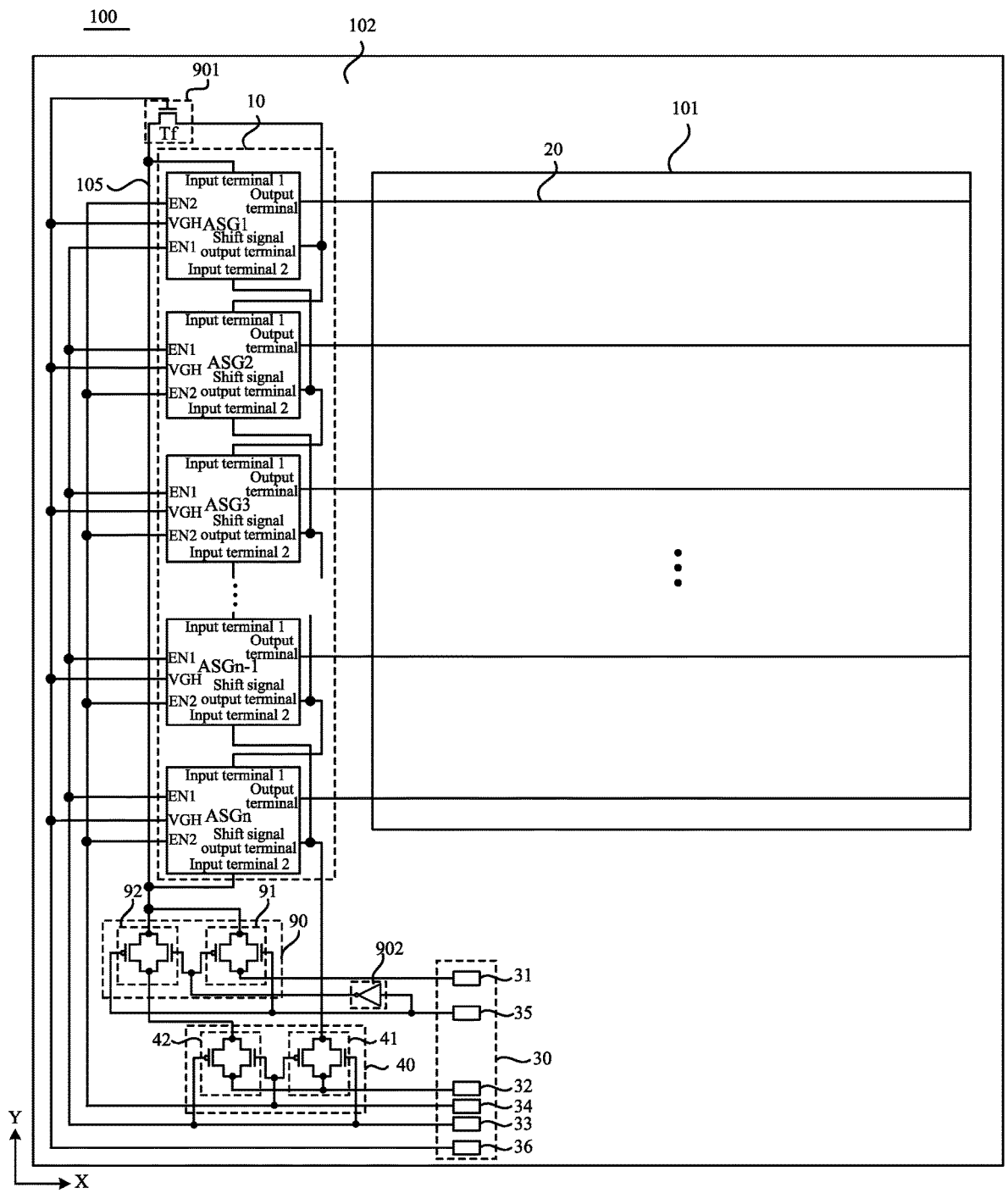
FIG. 21 is a diagram illustrating the structure of another display panel according to embodiments of the present application.

Exemplarily, FIG. 21 is a diagram illustrating the structure of another display panel according to embodiments of the present application. As shown in FIG. 21, the control terminal of the switch module 901 may further serve as the first electrode of the switch transistor Tf, the input terminal of the switch module 901 serves as the gate of the switch transistor Tf, and the output terminal of the switch module 901 serves as the second electrode of the switch transistor Tf. In this manner, the backward scan detection signal can be generated by the switch transistor Tf to the start signal transmission line 105 according to a signal that is output from the scan detection terminal of the first-stage scan drive unit ASG1 received by the first electrode of the switch transistor Tf and a fixed voltage signal of the gate of the switch transistor Tf and transmitted to the detection signal pin 32 by the start signal transmission line 105 through the turned-on fourth switch unit 92 and the turned-on second switch unit 42, and the backward scan function of the scan driving circuit 10 can be detected.

In one embodiment, with continued reference to FIG. 17, signal pins 30 further include a first level signal pin 36; first level signal input terminals VGH of the multi-stage scan drive units (ASG1, ASG2, ASG3, . . . , ASGn−1, ASGn) are all electrically connected to the first level signal pin 36; the first level signal pin 36 is configured to supply a first level signal V1. The first level signal V1 may serve as a fixed voltage signal supplied to the input terminal of the switch module 901. In this manner, a pin and a transmission line for exclusively supplying a fixed voltage signal to the switch module 901 are not necessary to dispose, the structure of the display panel can be simplified and the cost of the display panel can be lowered.

Additionally, the multi-stage scan drive units may each further include a first clock signal terminal, a second clock signal terminal, a second level signal input terminal, a reset signal input terminal and the others so that in the forward scan process, the multi-stage scan drive units can successively generate scan signals and shift signals according to the forward scan enable terminals, backward scan enable terminals, forward scan input terminals, first clock signal terminals, second clock signal terminals, first level signal input terminals, second level signal input terminals and reset signal input terminals of the multi-stage scan drive units and so that in the backward scan process, the multi-stage scan drive units can successively generate scan signals and shift signals according to the forward scan enable terminals, backward scan enable terminals, backward scan input terminals, first clock signal terminals, second clock signal terminals, first level signal input terminals, second level signal input terminals and reset signal input terminals of the multi-stage scan drive units.

Figure 22:
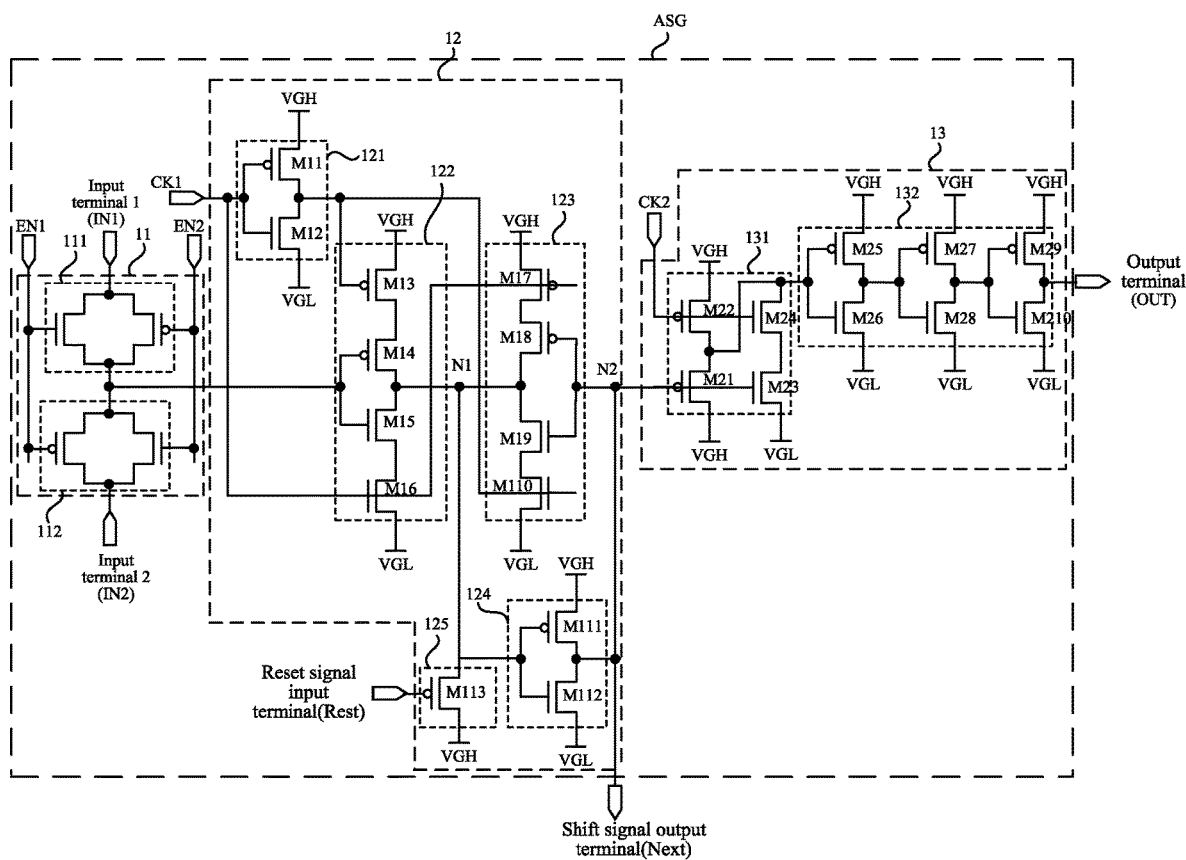
FIG. 22 is a diagram illustrating the specific circuit structure of a scan drive unit according to embodiments of the present application.

Exemplarily, FIG. 22 is a diagram illustrating the structure of a scan drive unit according to embodiments of the present application. As shown in FIG. 22, the scan drive unit ASG includes an input module 11, a shift module 12 and an output terminal 13. The input module 11 is composed of two transmission gates 111 and 112 so that a signal of the forward scan input terminal IN1 or a signal of the backward scan input terminal IN2 can be controlled to transmit to the shift module 12 according to the forward enable signal U2D of the forward scan enable terminal EN1 and the backward enable signal D2U of the backward scan enable terminal EN2.

The shift module 12 is composed of a first phase inverter 121, a second phase inverter 124, a first clock phase inverter 122, a second clock phase inverter 123 and a reset unit 125. An input terminal of the first phase inverter 121 is electrically connected to the first clock signal terminal CK1, an output terminal of the first phase inverter 121 is electrically connected to a control terminal of the first clock phase inverter 122 and a control terminal of the second clock phase inverter 123; an input terminal of the first clock phase inverter 122 is electrically connected to the input module 11 to receive a signal of the forward scan input terminal IN1 output from the input module 11 or a signal of the backward scan input terminal IN2 output from the input module 11; an output terminal of the first clock phase inverter 122 is electrically connected to an input terminal of the second phase inverter 124, and a clock terminal of the first clock phase inverter 122 is electrically connected to the first clock signal terminal CK1; an input terminal of the second clock phase inverter 123 is electrically connected to an output terminal of the second phase inverter 124, a clock terminal of the second clock phase inverter 123 is electrically connected to the first clock signal terminal CK1, and an output terminal of the second clock phase inverter 123 is electrically connected to the input terminal of the second phase inverter 124; the output terminal of the second phase inverter 124 is further electrically connected to the output module 13 and the shift signal output terminal Next. The first phase inverter 121 is composed of transistors M11 and M12. Moreover, when a first clock signal CKV1 received by the first clock signal terminal CK1 is at a low level, the first phase inverter 121 outputs the first level signal V1 of the first level signal terminal VGH received by a first electrode of the transistor M11, and when the first clock signal CKV1 received by the first clock signal terminal CK1 is at a high level, the first phase inverter 121 outputs the second level signal V2 of the second level signal terminal VGL received by a first electrode of the transistor M12. The first clock phase inverter 122 is composed of transistors M13, M14, M15 and M16. Moreover, when the first clock signal CKV1 received by the first clock signal terminal CK1 is at a high level, and a high-level signal is input by the input module 11, the first clock phase inverter 122 outputs the second level signal V2 of the second level signal terminal VGL received by a first electrode of the transistor M16, and when a low-level signal is input by the input module 11, and the first phase inverter 121 outputs the second level signal V2, the first clock phase inverter 122 outputs the first level signal V1 of the first level signal terminal VGH received by a first electrode of the transistor M13. The second clock phase inverter 123 is composed of transistors M17, M18, M19 and M110. Moreover, when the first clock signal CKV1 received by the first clock signal terminal CK1 is at a low level, and the second phase inverter 124 outputs a low-level signal, the second clock phase inverter 123 outputs the first level signal V1 of the first level signal terminal VGH received by a first electrode of the transistor M17, and when the first phase inverter 121 outputs the first level signal V1, and the second phase inverter 124 outputs a high-level signal, the second clock phase inverter 123 outputs the second level signal V2 of the second level signal terminal VGL received by a first electrode of the transistor M110. The second phase inverter 124 is composed of transistors M111 and M112. Moreover, when a high-level signal is input to the input terminal of the second phase inverter 124, the second phase inverter 124 outputs the second level signal V2 of the second level signal terminal VGL received by a first electrode of the transistor M112, and when a low-level signal is input to the input terminal of the second phase inverter 124, the second phase inverter 124 outputs the first level signal V1 of the first level signal terminal VGH received by a first electrode of the transistor M111. A control terminal of the reset unit 125 is electrically connected to the reset signal input terminal Rest, an input terminal of the reset unit 125 is electrically connected to the first level signal terminal VGH, and an output terminal of the reset unit 125 is electrically connected to the input terminal of the second phase inverter 124. The reset unit 125 is composed of a transistor M 113 to reset a signal of the input terminal of the second phase inverter 124 according to a reset signal Vrest of the reset signal input terminal Rest.

The output module 13 is composed of a NAND gate circuit 131 and a buffer circuit 132. The NAND gate circuit 131 is composed of transistors M21, M22, M23 and M24 to implement the NAND function between a second clock signal of the second clock signal terminal CK2 and a shift signal Vnext output from the shift module 12. The buffer circuit 132 is composed of three phase inverters composed of transistors M25, M26, M27, M28, M29 and M210 to transmit a signal output from the NAND circuit 131 to the scan signal output terminal OUT, and the scan signal Gout is output.

Figure 23:
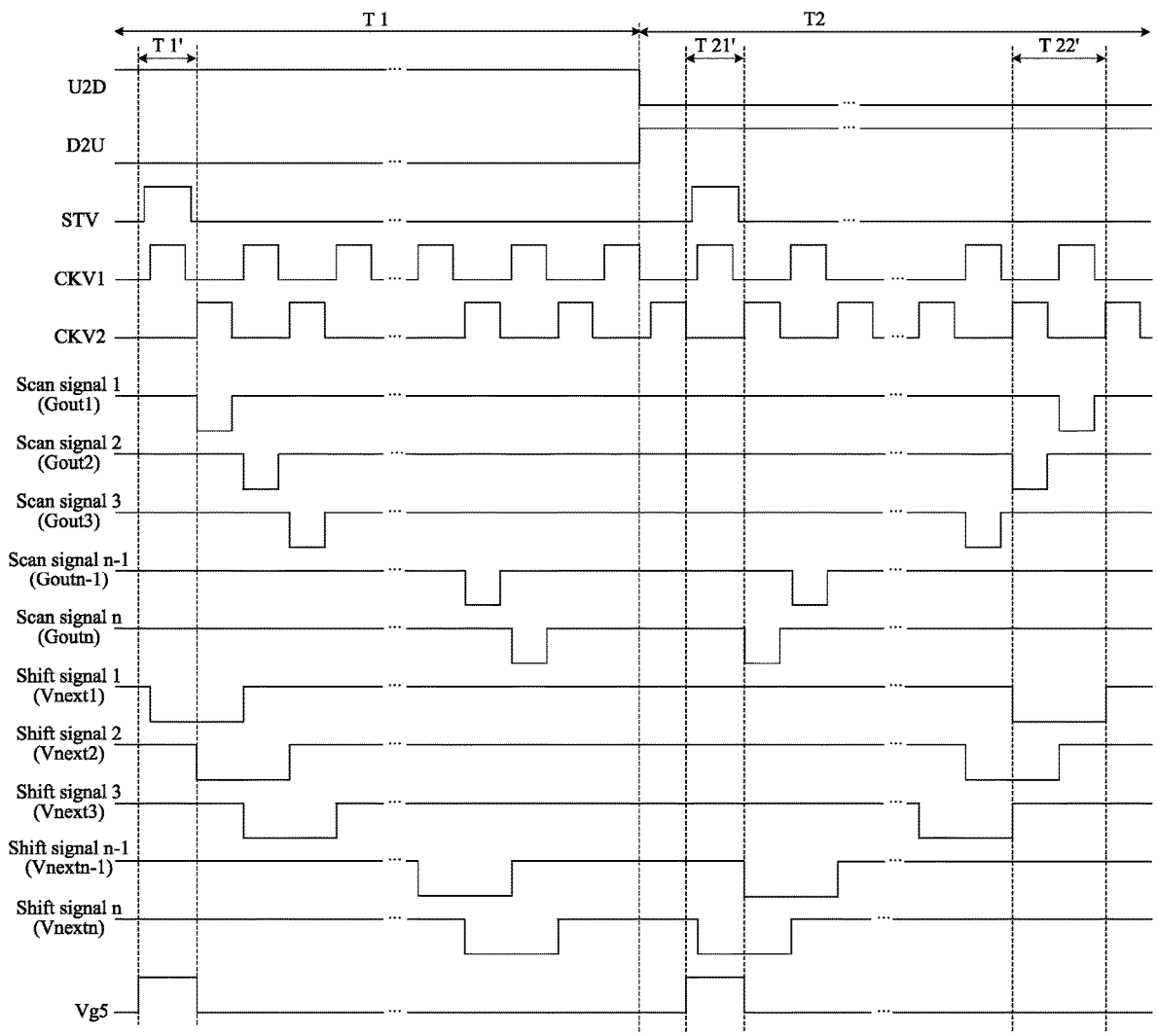
FIG. 23 is a detection timing diagram of another scan driving circuit according to embodiments of the present application.

Exemplarily, FIG. 23 is a detection timing diagram of another scan driving circuit according to embodiments of the present application. As shown in FIGS. 17, 23 and 22, in the forward scan detection stage T1, the high-level fifth control signal Vg5 of the control signal pin 35 is configured to control the third n-type transistor N3 and the third p-type transistor P3 of the third switch unit 91 of the second gating circuit 90 to turn on so that the start signal STV of the start signal pin 31 can be transmitted to the forward scan input terminal IN1 of the first-stage scan drive unit ASG1 through the turned-on third switch unit 91 and the start signal transmission line 105; a high-level forward enable signal U2D of the forward enable signal pin 33 and a low-level backward enable signal D2U of the backward enable signal pin 34 are configured to control the first n-type transistor N1 and the first p-type transistor P1 of the first switch unit 41 of the first gating circuit 40 to turn on, and a signal of the forward scan input terminal IN1 of each stage of the multi-stage scan drive units ASG is input to the shift module 12 of the each stage of the multi-stage scan drive units ASG so that the shift module 12 of the each stage of the multi-stage scan drive units ASG selects the first level signal V1 of the first level signal terminal VGH of the each stage of the multi-stage scan drive units ASG or the second level signal V2 of the second level signal terminal VGL of the each stage of the multi-stage scan drive units ASG as the shift signal Vnext of the each stage of the multi-stage scan drive units ASG according to the signal of the forward scan input terminal IN1 of the each stage of the multi-stage scan drive units ASG and the first clock signal CKV1 of the first clock signal terminals CK1 of the each stage of the multi-stage scan drive units ASG and so that the multi-stage scan drive units ASG from the first-stage scan drive unit ASG1 to the Nth-stage scan drive unit ASGn successively output shift signals (Vnext1, Vnext2, Vnext3, . . . , Vnextn−1, Vnextn) to the forward scan input terminals IN1 of next-stage scan drive units. Moreover, the output module 13 of the each stage of the multi-stage scan drive units ASG selects the first level signal V1 of the first level signal terminal VGH of the each stage of the multi-stage scan drive units ASG or the second level signal V2 of the second level signal terminal VGL of the each stage of the multi-stage scan drive units ASG as the scan signal Gout according to the second clock signal CKV2 of the second clock signal terminal CK2 of the each stage of the multi-stage scan drive units ASG and the shift signal Vnext of the shift module 12 of the each stage of the multi-stage scan drive units ASG, and the multi-stage scan drive units ASG from the first-stage scan drive unit ASG1 to the Nth-stage scan drive unit ASGn successively output scan signals (Gout1, Gout2, Gout3, . . . , Goutn−1, Goutn). At the time, the forward scan detection signal of the scan signal detection terminal of the Nth-stage scan drive unit ASGn is transmitted to the detection signal pin 32 through the turned-on first switch unit 41 of the first gating circuit 40 so that the forward scan function of the scan driving circuit 10 can be detected according to the forward scan detection signal received by the detection signal pin 32.

In the backward scan detection stage T2, the control signal pin 35 supplies the high-level fifth control signal Vg5 to control the third n-type transistor N3 and the third p-type transistor P3 of the third switch unit 91 of the second gating circuit 90 to turn on in the duration T21' from the start moment to the stop moment of the effective pulse of the start signal STV of the start signal pin 31 so that the start signal STV of the start signal pin 31 can be transmitted to the backward scan input terminal IN2 of the Nth-stage scan drive unit ASGn through the turned-on third switch unit 91 and the start signal transmission line 105; the control signal pin 35 supplies the low-level fifth control signal Vg5 to control the fourth n-type transistor and the fourth p-type transistor of the fourth switch unit 92 of the second gating circuit 90 to turn on in the period T22' after the stop moment of the effective pulse of the start signal STV of the start signal pin 31. Moreover, a low-level forward enable signal U2D of the forward enable signal pin 33 and a high-level backward enable signal D2U of the backward enable signal pin 34 are configured to control the second n-type transistor and the second p-type transistor of the second switch unit 42 of the first gating circuit 40 to turn on, and a signal of the backward scan input terminal IN2 of the each stage of the multi-stage scan drive units ASG is input to the shift module 12 so that the shift module 12 of the each stage of the multi-stage scan drive units ASG selects the first level signal V1 of the first level signal terminal VGH or the second level signal V2 of the second level signal terminal VGL as the shift signal Vnext according to the signal of the backward scan input terminal IN2 and the first clock signal CKV1 of the first clock signal terminals CK1 and so that the multi-stage scan drive units ASG from the Nth-stage scan drive unit ASGn to the first-stage scan drive unit ASG1 successively output shift signals (Vnextn, Vnextn−1, . . . , Vnext3, Vnext2, Vnext1) to the backward scan input terminals IN2 of previous-stage scan drive units. Correspondingly, the output module 13 of the each stage of the multi-stage scan drive units ASG selects the first level signal V1 of the first level signal terminal VGH or the second level signal V2 of the second level signal terminal VGL as the scan signal Gout according to the second clock signal CKV2 of the second clock signal terminal CK2 and the shift signal Vnext of the shift module 12, and the multi-stage scan drive units ASG from the Nth-stage scan drive unit ASGn to the first-stage scan drive unit ASG1 successively output scan signals (Goutn, Goutn−1, Gout3, Gout2, Gout1). At the time, the backward scan detection signal is generated by the switch module 901 according to a signal of the scan signal detection terminal of the first-stage scan drive unit ASG1 and the first level signal V1 of the first level signal pin 36 and transmitted to the detection signal pin 32 through the start signal transmission line 105, the turned-on fourth switch unit 92 of the second gating circuit 90 and the turned-on second switch unit 42 of the first gating circuit 40 so that the backward scan function of the scan driving circuit 10 can be detected according to the backward scan detection signal received by the detection signal pin 32.

In the embodiment of the present application, on the premise that the forward scan function and the backward scan function of the scan driving circuit in the display panel can be detected, the start signal transmission line also serves to transmit the backward scan detection signal to reduce the number of signal lines disposed in the display panel so that the bezel size of the display panel can be reduced, and the screen-to-body ratio of the display panel can be improved; moreover, the signal pin for supplying an enable signal to the multi-stage scan drive units also serves as the pin for supplying a control signal to transistors in the first gating circuit, and the same signal pin is used for supplying a control signal to transistors in the second gating circuit so that the number of signal pins disposed in the display panel can be reduced, the structure of the display panel can be simplified and the cost of the display panel can be lowered.

Embodiments of the present application further provide a detection method of a display panel. The detection method may be configured to detect the display panel according to the embodiments of the present application. The detection method includes at least a forward scan detection stage and a backward scan detection stage. FIG. 24 is a flowchart illustrating a detection method according to embodiments of the present application. As shown in FIG. 24, the detection method of the display panel includes the steps below.

In S110, in the forward scan detection stage, a start signal is supplied and the multi-stage scan drive units from the first-stage scan drive unit to the Nth-stage scan drive unit successively output shift signals and scan signals; and the first switch unit is controlled to turn on, the second switch unit is controlled to turn off, a signal of the scan signal detection terminal of the Nth-stage scan drive unit is received as the forward scan detection signal through the first switch unit, and the forward scan function of the scan driving circuit is detected according to the forward scan detection signal. The forward scan detection signal is a shift signal output from the Nth-stage scan drive unit or a scan signal output from the Nth-stage scan drive unit.

In S120, in the backward scan detection stage, a start signal is supplied and the multi-stage scan drive units from the Nth-stage scan drive unit to the first-stage scan drive unit successively output shift signals and scan signals; and the first switch unit is controlled to turn off, the second switch unit is controlled to turn on, a signal of the scan signal detection terminal of the first-stage scan drive unit is received as the backward scan detection signal through the second switch unit, and the backward scan function of the scan driving circuit is detected according to the backward scan detection signal. The backward scan detection signal is a shift signal output from the first-stage scan drive unit or a scan signal output from the first-stage scan drive unit.

In this manner, a start signal is supplied to the first-stage shift register unit through the start signal pin, a shift signal output from the shift signal output terminal of the Nth-stage shift register unit serves as the forward scan detection signal, and the forward scan detection signal is received through the detection signal and the turned-om first switch unit, so that the forward scan function of the scan driving circuit can be detected according to the forward scan detection signal; correspondingly, a start signal is supplied to the Nth-stage shift register unit through the start signal pin, a shift signal output from the shift signal output terminal of the first-stage shift register unit serves as the backward scan detection signal, and the backward scan detection signal is received through the detection signal pin and the turned-on second switch unit, so that the backward scan function of the scan driving circuit can be detected according to the backward scan detection signal. In this manner, the same detection signal pin can be used for detecting the forward scan function and the backward scan function of the display panel can be detected so that the number of signal pins disposed in the display panel can be reduced, the structure of the display panel can be simplified and the cost of the display panel can be lowered.

In one embodiment, as shown in FIGS. 1 and 4, the first switch unit 41 of the first gating circuit 40 includes the first transmission gate, the first transmission gate includes the first n-type transistor N1 and the first p-type transistor P1; the first electrode of the first n-type transistor N1 and the first electrode of the first P-type transistor P1 are both the input terminal of the first switch unit 41; the second electrode of the first n-type transistor N1 and the second electrode of the first p-type transistor P1 are both the output terminal of the first switch unit 41; the gate of the first n-type transistor N1 is configured to receive the first control signal Vg1, and the gate of the first p-type transistor P1 is configured to receive the second control Vg2. The second switch unit 42 of the first gating circuit 40 includes the second transmission gate, the second transmission gate includes the second n-type transistor N2 and the second p-type transistor P2, the first electrode of the second n-type transistor N2 and the first electrode of the second p-type transistor P2 are both the input terminal of the second switch unit 42; the second electrode of the second n-type transistor N2 and the second electrode of the second p-type transistor P2 are both the output terminal of the second switch unit 42; the gate of the second n-type transistor N2 is configured to receive the third control signal Vg3, and the gate of the second p-type transistor P2 is configured to receive the fourth control signal Vg4.

The forward scan detection stage includes that a start signal is supplied and the multi-stage scan drive units from the first-stage scan drive unit ASG1 to the Nth-stage scan drive unit ASGn successively output shift signals and scan signals; the first control signal Vg1 is configured to control the first n-type transistor N1 to turn on, the second control signal Vg2 is configured to control the first P-type transistor P1 to turn on, the third control signal Vg3 is configured to control the second n-type transistor N2 to turn off, and the fourth control signal Vg4 is configured to control the second p-type transistor P2 to turn off, and the first transmission gate is turned on, the second transmission gate is turned off, the forward scan detection signal of the scan signal detection terminal of the Nth-stage scan drive unit ASGn is received through the first transmission gate, and the forward scan function of the scan driving circuit 10 is detected according to the forward scan detection signal.

The backward scan detection stage includes that a start signal is supplied and the multi-stage scan drive units from the Nth-stage scan drive unit ASGn to the first-stage scan drive unit ASG1 successively output shift signals and scan signals; the first control signal Vg1 is configured to control the first n-type transistor N1 to turn off, the second control signal Vg2 is configured to control the first p-type transistor P1 to turn off, the third control signal Vg3 is configured to control the second n-type transistor N2 to turn on, and the fourth control signal Vg4 is configured to control the second p-type transistor P2 to turn on, and the first transmission gate is turned off, the second transmission gate is turned on, the backward scan detection signal of the scan signal detection terminal of the first-stage scan drive unit ASG1 is received through the turned-on second transmission gate, and the backward scan function of the scan driving circuit 10 is detected according to the backward scan detection signal.

In this manner, when the first transmission gate is used for transmitting the forward scan detection signal, the loss of the forward scan detection signal can be reduced in the transmission process so that the detection accuracy of the forward scan function of the display pane can be improved when the forward scan function of the display panel is detected according to the forward scan detection signal. Moreover, when the second transmission gate is used for transmitting the backward scan detection signal, the loss of the backward scan detection signal can be reduced in the transmission process so that the detection accuracy of the backward scan function of the display panel can be improved when the backward scan function of the display panel is detected according to the backward scan detection signal.

In one embodiment, as shown in FIG. 15, the display panel 100 further includes the start signal transmission line 105, a second gating circuit 90 and a switch module 901; the second gating circuit 90 includes the third switch unit 91 and the fourth switch unit 92; the first terminal of the start signal transmission line 105 is electrically connected to the output terminal of the third switch unit 91, the input terminal of the fourth switch unit 92 and the backward scan input terminal of the Nth-stage scan drive unit ASGn; the second terminal of the start signal transmission line 105 is electrically connected to the forward scan input terminal of the first-stage scan drive unit ASG1 and the output terminal of the switch module 901; the input terminal of the third switch unit 901 is electrically connected to the start signal pin 31; the output terminal of the fourth switch unit 92 is electrically connected to the input terminal of the second switch unit 42; the input terminal of the switch module 901 is configured to receive a fixed voltage signal; the control terminal of the switch module 901 is electrically connected to the scan signal detection terminal of the first-stage scan drive unit ASG1.

The backward scan detection stage includes a first stage, a second stage and a third stage. FIG. 25 is a flowchart illustrating a backward scan detection method according to embodiments of the present application. As shown in FIG. 25, the backward scan detection method of the display panel includes the steps below.

In S121, in the first stage, the third switch unit is turned on, the fourth switch unit is turned off, and a start signal is output to the start signal transmission line through the third switch unit and the multi-stage scan drive units from the Nth-stage scan drive unit to the first-stage scan drive unit successively output scan signals and shift signals.

In S122, in the second stage, the second switch unit and the fourth switch unit are turned on, and the first switch unit and the third switch unit are turned off, and the switch module outputs the backward scan detection signal according to a signal of the scan signal detection terminal of the first-stage drive unit.

In S123, in the third stage, the backward scan detection signal is received through the start signal transmission line, the fourth switch unit and the second switch unit, and the backward scan function of the scan drive unit is detected according to the backward scan detection signal.

In the first stage, the third switch unit and the fourth switch unit of the second gating circuit are controlled to turn on, and the effective pulse of the start signal of the start signal pin is transmitted to the start signal transmission line through the turned-on third switch unit and then to the backward scan input terminal of the Nth-stage scan drive unit through the start signal transmission line so that the multi-stage scan drive units from the Nth-stage scan drive unit to the first-stage scan drive unit successively generate shift signals and scan signals; in the second stage, the start signal pin does not supply the effective pulse of the start signal, and the fourth switch unit of the second gating circuit and the second switch unit of the first gating circuit are controlled to turn on, and the third switch unit of the second gating circuit and the first switch unit of the first gating circuit are controlled to turn off so that the backward scan detection signal is output to the start signal transmission line by the switch module according to a signal of the scan signal detection terminal of the first-stage scan drive unit, then to the input terminal of the fourth switch unit through the start signal transmission line and to the detection signal pin through the turned-on fourth switch unit and the turned-on second switch unit successively. In this manner, with the configuration in which the third switch unit and the fourth switch unit of the second gating circuit are controlled to turn on in a time-division manner, on the premise that the backward scan function of the display panel can be detected, the start signal transmission line also serves to transmit the backward scan detection signal so that the number of signal lines disposed in the display panel can be reduced, the bezels of the display panel can be narrower and the screen-to-body ratio of the display panel can be improved.

Figure 26:
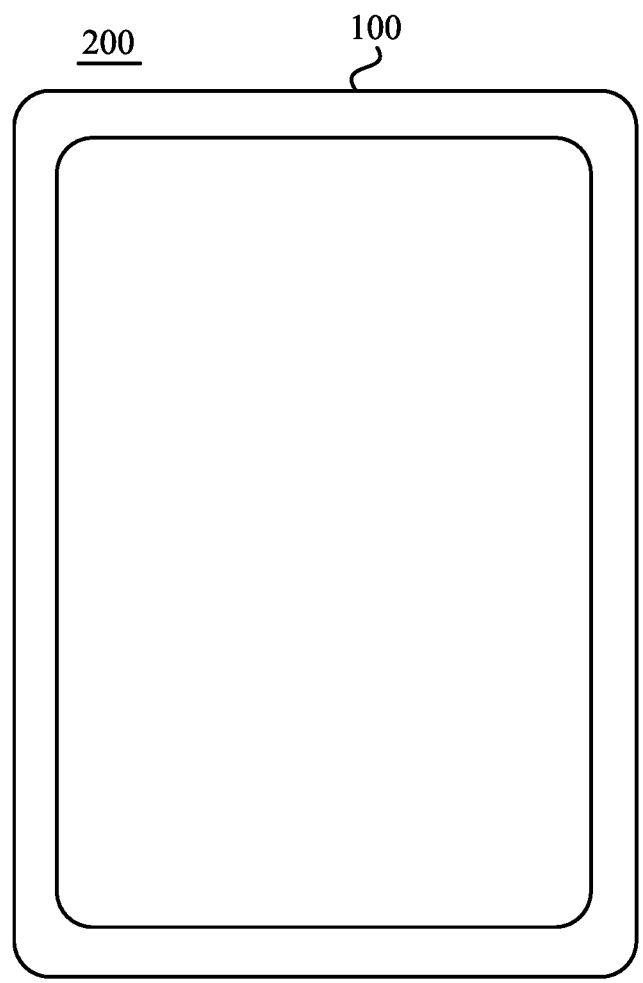
FIG. 26 is a diagram illustrating the structure of a display device according to embodiments of the present application.

Embodiments of the present application further provide a display device. The display device includes the display panel provided by the embodiments of the present application. Therefore, the display device has the features and effects of the display panel provided by the embodiments of the present application, and similar parts can be referred to the preceding descriptions of the display panel provided by the embodiments of the present application and are not repeated here. Exemplarily, FIG. 26 is a diagram illustrating the structure of a display device according to embodiments of the present application. As shown in FIG. 26, the display device 200 includes the display panel 100 provided by the embodiments of the present application. The display panel may be, for example, on-board display screens, mobile phones, computer displays and other known display devices.

What is claimed is:

1. A display panel, comprising:
    a plurality of signal pins comprising at least a start signal pin and a detection signal pin;
    a scan driving circuit and a plurality of scan signal lines, wherein the scan driving circuit comprises N scan drive units disposed in a cascade manner, wherein N is a positive integer greater than or equal to 2; scan signal output terminals of the N scan drive units are electrically connected to the plurality of scan signal lines with a one-to-one correspondence; for each of the N scan drive units, a forward scan input terminal of a current-stage scan drive unit is electrically connected to a shift signal output terminal of a previous-stage scan drive unit of the current-stage scan drive unit, a backward scan input terminal of the current-stage scan drive unit is electrically connected to a shift signal output terminal of a next-stage scan drive unit of the current-stage scan drive unit, and a forward scan input terminal of a first-stage scan drive unit and a backward scan input terminal of an Nth-stage scan drive unit are both electrically connected to the start signal pin, wherein the current-stage scan drive unit is not the first-stage scan drive unit and not the Nth-stage scan drive unit; and a first gating circuit comprising a first switch unit and a second switch unit, wherein an input terminal of the first switch unit is electrically connected to a scan signal detection terminal of the Nth-stage scan drive unit, an input terminal of the second switch unit is electrically connected to a scan signal detection terminal of the first-stage scan drive unit, an output terminal of the first switch unit and an output terminal of the second switch unit are both electrically connected to the detection signal pin; the first switch unit is configured to turn on in a forward scan detection stage and turn off in a backward scan detection stage, and the second switch unit is configured to turn on in the backward scan detection stage and turn off in the forward scan detection stage, wherein the scan signal detection terminal of the Nth-stage scan drive unit is a shift signal output terminal of the Nth-stage scan drive unit or a scan signal output terminal of the Nth-stage scan drive unit, and the scan signal detection terminal of the first-stage scan drive unit is a shift signal output terminal of the first-stage scan drive unit or a scan signal output terminal of the first-stage scan drive unit.

2. The display panel according to claim 1, wherein the first switch unit comprises a first transmission gate, the first transmission gate comprises a first n-type transistor and a first p-type transistor, a first electrode of the first n-type transistor and a first electrode of the first p-type transistor are both the input terminal of the first switch unit, a second electrode of the first n-type transistor and a second electrode of the first p-type transistor are both the output terminal of the first switch unit, a gate of the first n-type transistor is configured to receive a first control signal, and a gate of the first p-type transistor is configured to receive a second control signal; and the second switch unit comprises a second transmission gate, the second transmission gate comprises a second n-type transistor and a second p-type transistor, a first electrode of the second n-type transistor and a first electrode of the second p-type transistor are both the input terminal of the second switch unit, a second electrode of the second n-type transistor and a second electrode of the second p-type transistor are both the output terminal of the second switch unit, a gate of the second n-type transistor is configured to receive a third control signal, and a gate of the second p-type transistor is configured to receive a fourth control signal.

3. The display panel according to claim 2, wherein the first control signal also serves as the fourth control signal, and the second control signal also serves as the third control signal.

4. The display panel according to claim 3, wherein the plurality of signal pins further comprise a forward enable signal pin and a backward enable signal pin;

forward scan enable terminals of the N scan drive units are all electrically connected to the forward enable signal pin, and backward scan enable terminals of the N scan drive units are all electrically connected to the backward enable signal pin; and the gate of the first n-type transistor and the gate of the second p-type transistor are both electrically connected to the forward enable signal pin, and the gate of the second n-type transistor and the gate of the first p-type transistor are both electrically connected to the backward enable signal pin.

5. The display panel according to claim 1, further comprising a backward scan detection signal transmission line, wherein an extension direction of the backward scan detection signal transmission line intersects an extension direction of the plurality of scan signal lines; and the input terminal of the second switch unit is electrically connected to the scan signal detection terminal of the first-stage scan drive unit through the backward scan detection signal transmission line.

6. The display panel according to claim 5, further comprising a plurality of data signal lines, a plurality of signal wires and a plurality of sub-pixels arranged in an array, wherein a same row of sub-pixels of the plurality of sub-pixels are electrically connected to a same one of the plurality of scan signal lines, a same column of sub-pixels of the plurality of sub-pixels are electrically connected to a same one of the plurality of data signal lines, and an extension direction of the plurality of signal wires intersects the extension direction of the plurality of scan signal lines;

wherein the plurality of sub-pixels comprise a plurality of display sub-pixels and a plurality of non-display sub-pixels located at at least one side of the plurality of display sub-pixels; and wherein among the plurality of data signal lines, a data signal line electrically connected to a same column of non-display sub-pixels of the plurality of non-display sub-pixels is a virtual data signal line, and at least one virtual data signal line also serves as the backward scan detection signal transmission line; or wherein at least one of the plurality of signal wires is at least one virtual signal wire, and at least one of the at least one virtual signal wire also serves as the backward scan detection signal transmission line.

7. The display panel according to claim 6, further comprising:

a base substrate;

a first metal layer, a second metal layer and a third metal layer, wherein the first metal layer, the second metal layer and the third metal layer are located on one side of the base substrate and insulatively spaced apart, the first metal layer comprises the plurality of scan signal lines, the second metal layer comprises the plurality of data signal lines, and the third metal layer comprises the plurality of signal wires.

8. The display panel according to claim 6, further comprising a first connection line, wherein an extension direction of the first connection line intersects the extension direction of the backward scan detection signal transmission line; and a first terminal of the first connection line is electrically connected to the input terminal of the second switch unit through the backward scan detection signal transmission line, and a second terminal of the first connection line is electrically connected to the scan signal detection terminal of the first-stage scan drive unit.

9. The display panel according to claim 8, wherein the first connection line is in a same layer as the plurality of scan signal lines, or the first connection line is in a same layer as the plurality of data signal lines, or the first connection line is in a same layer as the plurality of signal wires.

10. The display panel according to claim 8, wherein a scan signal line electrically connected to the scan signal output terminal of the first-stage scan drive unit is a virtual scan signal line, and the virtual scan signal line is electrically connected to none of the plurality of display sub-pixels; and
    in a case where the scan signal detection terminal of the first-stage scan drive unit is the scan signal output terminal of the first-stage scan drive unit, at least part of the virtual scan signal line also serves as the first connection line.

11. The display panel according to claim 1, further comprising a start signal transmission line, a second gating circuit and a switch module, wherein
    the second gating circuit comprises a third switch unit and a fourth switch unit;
    a first terminal of the start signal transmission line is electrically connected to an output terminal of the third switch unit, an input terminal of the fourth switch unit and the backward scan input terminal of the Nth-stage scan drive unit, and a second terminal of the start signal transmission line is electrically connected to the forward scan input terminal of the first-stage scan drive unit and an output terminal of the switch module;
    an input terminal of the third switch unit is electrically connected to the start signal pin, an output terminal of the fourth switch unit is electrically connected to the input terminal of the second switch unit, the third switch unit is configured to turn on when the start signal pin supplies an effective pulse of a start signal, and the fourth switch unit is configured to turn on when a backward scan detection signal is output; and
    an input terminal of the switch module is configured to receive a fixed voltage signal, a control terminal of the switch module is electrically connected to the scan signal detection terminal of the first-stage scan drive unit, and the switch module is configured to output the backward scan detection signal according to a signal of the scan signal detection terminal of the first-stage scan drive unit in the backward scan detection stage.

12. The display panel according to claim 11, wherein the third switch unit comprises a third transmission gate, the third transmission gate comprises a third n-type transistor and a third p-type transistor, a first electrode of the third n-type transistor and a first electrode of the third p-type transistor are both the input terminal of the third switch unit, a second electrode of the third n-type transistor and a second electrode of the third p-type transistor are both the output terminal of the third switch unit, a gate of the third n-type transistor is configured to receive a fifth control signal, and a gate of the third p-type transistor is configured to receive a sixth control signal; and
    the fourth switch unit comprises a fourth transmission gate, the fourth transmission gate comprises a fourth n-type transistor and a fourth p-type transistor, a first electrode of the fourth n-type transistor and a first electrode of the fourth p-type transistor are both the input terminal of the fourth switch unit, a second electrode of the fourth n-type transistor and a second electrode of the fourth p-type transistor are both the output terminal of the fourth switch unit, a gate of the fourth n-type transistor is configured to receive a seventh control signal, and a gate of the fourth p-type transistor is configured to receive an eighth control signal.

13. The display panel according to claim 12, wherein the fifth control signal also serves as the eighth control signal, and the sixth control signal also serves as the seventh control signal.

14. The display panel according to claim 13, further comprising a phase inverter,
    wherein the plurality of signal pins further comprise a control signal pin, wherein
    the control signal pin is configured to supply the fifth control signal, an input terminal of the phase inverter is electrically connected to the control signal pin, an output terminal of the phase inverter is electrically connected to the gate of the third p-type transistor and the gate of the fourth n-type transistor, and the gate of the third n-type transistor and the gate of the fourth p-type transistor are both electrically connected to the control signal pin; or
    the control signal pin is configured to supply the sixth control signal, an input terminal of the phase inverter is electrically connected to the control signal pin, an output terminal of the phase inverter is electrically connected to the gate of the third n-type transistor and the gate of the fourth p-type transistor, and the gate of the third p-type transistor and the gate of the fourth n-type transistor are both electrically connected to the control signal pin.

15. The display panel according to claim 11, wherein the switch module comprises a switch transistor, wherein
    a gate of the switch transistor serves as the control terminal of the switch module, a first electrode of the switch transistor serves as the input terminal of the switch module, and a second electrode of the switch transistor serves as the output terminal of the switch module; or
    a first electrode of the switch transistor serves as the control terminal of the switch module, a gate of the switch transistor serves as the input terminal of the switch module, and a second electrode of the switch transistor serves as the output terminal of the switch module.

16. The display panel according to claim 11, wherein the plurality of signal pins further comprise a first level signal pin,
    wherein first level signal input terminals of the N scan drive units are all electrically connected to the first level signal pin, and the first level signal pin is configured to supply a first level signal, and
    wherein the first level signal also serves as the fixed voltage signal.

17. A detection method of a display panel, wherein display panel comprises a plurality of signal pins comprising at least a start signal pin and a detection signal pin;
    a scan driving circuit and a plurality of scan signal lines, wherein the scan driving circuit comprises N scan drive units disposed in a cascade manner, wherein N is a positive integer greater than or equal to 2; scan signal output terminals of the N scan drive units are electrically connected to the plurality of scan signal lines with a one-to-one correspondence; for each of the N scan drive units, a forward scan input terminal of a current-stage scan drive unit is electrically connected to a shift signal output terminal of a previous-stage scan drive unit of the current-stage scan drive unit, a backward scan input terminal of the current-stage scan drive unit is electrically connected to a shift signal output terminal of a next-stage scan drive unit of the current-stage scan drive unit, and a forward scan input terminal of a first-stage scan drive unit and a backward scan input terminal of an Nth-stage scan drive unit are both electrically connected to the start signal pin, wherein the current-stage scan drive unit is not the first-stage scan drive unit and not the Nth-stage scan drive unit; and a first gating circuit comprising a first switch unit and a second switch unit, wherein an input terminal of the first switch unit is electrically connected to a scan signal detection terminal of the Nth-stage scan drive unit, an input terminal of the second switch unit is electrically connected to a scan signal detection terminal of the first-stage scan drive unit, an output terminal of the first switch unit and an output terminal of the second switch unit are both electrically connected to the detection signal pin; the first switch unit is configured to turn on in a forward scan detection stage and turn off in a backward scan detection stage, and the second switch unit is configured to turn on in the backward scan detection stage and turn off in the forward scan detection stage, wherein the scan signal detection terminal of the Nth-stage scan drive unit is a shift signal output terminal of the Nth-stage scan drive unit or a scan signal output terminal of the Nth-stage scan drive unit, and the scan signal detection terminal of the first-stage scan drive unit is a shift signal output terminal of the first-stage scan drive unit or a scan signal output terminal of the first-stage scan drive unit;

the detection method comprises at least a forward scan detection stage and a backward scan detection stage, in the forward scan detection stage, supplying, by the start signal pin, a start signal and multi-stage scan drive units from the first-stage scan drive unit to the Nth-stage scan drive unit successively output shift signals and scan signals; controlling the first switch unit to turn on and the second switch unit to turn off, receiving through the first switch unit a signal of a scan signal detection terminal of the Nth-stage scan drive unit as a forward scan detection signal, and detecting a forward scan function of a scan driving circuit according to the forward scan detection signal, wherein the forward scan detection signal is a shift signal output from the Nth-stage scan drive unit or a scan signal output from the Nth-stage scan drive unit; and in the backward scan detection stage, supplying, by the start signal pin, a start signal and the multi-stage scan drive units from the Nth-stage scan drive unit to the first-stage scan drive unit successively output shift signals and scan signals; controlling the first switch unit to turn off and the second switch unit to turn on, receiving through the second switch unit a signal of a scan signal detection terminal of the first-stage scan drive unit as a backward scan detection signal, and detecting a backward scan function of the scan driving circuit according to the backward scan detection signal, wherein the backward scan detection signal is a shift signal output from the first-stage scan drive unit or a scan signal output from the first-stage scan drive unit.

18. The detection method according to claim 17, wherein the first switch unit comprises a first transmission gate, the first transmission gate comprises a first n-type transistor and a first p-type transistor, a first electrode of the first n-type transistor and a first electrode of the first p-type transistor are both input terminals of the first switch unit, a second electrode of the first n-type transistor and a second electrode of the first p-type transistor are both output terminals of the first switch unit, a gate of the first n-type transistor is configured to receive a first control signal, and a gate of the first p-type transistor is configured to receive a second control signal; the second switch unit comprises a second transmission gate, the second transmission gate comprises a second n-type transistor and a second p-type transistor, a first electrode of the second n-type transistor and a first electrode of the second p-type transistor are both input terminals of the second switch unit, a second electrode of the second n-type transistor and a second electrode of the second p-type transistor are both output terminals of the second switch unit, a gate of the second n-type transistor is configured to receive a third control signal, and a gate of the second p-type transistor is configured to receive a fourth control signal;

the forward scan detection stage comprises: supplying, by the start signal pin, a start signal and the multi-stage scan drive units from the first-stage scan drive unit to the Nth-stage scan drive unit successively output the shift signals and the scan signals; controlling, by the first control signal, the first n-type transistor to turn on, controlling, by the second control signal, the first p-type transistor to turn on, controlling, by the third control signal, the second n-type transistor to turn off, and controlling, by the fourth control signal, the second p-type transistor to turn off, and the first transmission gate is turned on and the second transmission gate is turned off;

receiving the forward scan detection signal of the scan signal detection terminal of the Nth-stage scan drive unit through the first transmission gate, and detecting the forward scan function of the scan driving circuit according to the forward scan detection signal; and the backward scan detection stage comprises: supplying, by the start signal pin, a start signal and the multi-stage scan drive units from the Nth-stage scan drive unit to the first-stage scan drive unit successively output the shift signals and the scan signals; controlling, by the first control signal, the first n-type transistor to turn off, controlling, by the second control signal, the first p-type transistor to turn off, controlling, by the third control signal, the second n-type transistor to turn on, and controlling, by the fourth control signal, the second p-type transistor to turn on, and the first transmission gate is turned off and the second transmission gate is turned on; receiving the backward scan detection signal of the scan signal detection terminal of the first-stage scan drive unit through the turned-on second transmission gate, and detecting the backward scan function of the scan driving circuit according to the backward scan detection signal.

19. The detection method according to claim 17, wherein the display panel further comprises a start signal transmission line, a second gating circuit and a switch module, the second gating circuit comprises a third switch unit and a fourth switch unit, a first terminal of the start signal transmission line is electrically connected to an output terminal of the third switch unit, an input terminal of the fourth switch unit and a backward scan input terminal of the Nth-stage scan drive unit, a second terminal of the start signal transmission line is electrically connected to a forward scan input terminal of the first-stage scan drive unit and an output terminal of the switch module; an input terminal of the third switch unit is electrically connected to the start signal pin, an output terminal of the fourth switch unit is electrically connected to the input terminal of the second switch unit, an input terminal of the switch module is configured to receive a fixed voltage signal, a control terminal of the switch module is electrically connected to the scan signal detection terminal of the first-stage scan drive unit; and the backward scan detection stage comprises a first stage, a second stage and a third stage, wherein the detection method further comprises:

in the first stage, turning on the third switch unit, turning off the fourth switch unit, and transmitting the start signal to the start signal transmission line through the third switch unit and the multi-stage scan drive units from the Nth-stage scan drive unit to the first-stage scan drive unit successively output the scan signals and the shift signals;

in the second stage, turning on the second switch unit and the fourth switch unit, turning off the first switch unit and the third switch unit, and outputting, by the switch module, the backward scan detection signal according to the signal of the scan signal detection terminal of the first-stage drive unit; and in the third stage, receiving the backward scan detection signal through the start signal transmission line, the fourth switch unit and the second switch unit, and detecting the backward scan function of the scan driving circuit according to the backward scan detection signal.

20. A display device, comprising a display panel, wherein the display panel comprises:

a plurality of signal pins comprising at least a start signal pin and a detection signal pin;

a scan driving circuit and a plurality of scan signal lines, wherein the scan driving circuit comprises N scan drive units disposed in a cascade manner, wherein N is a positive integer greater than or equal to 2; scan signal output terminals of the N scan drive units are electrically connected to the plurality of scan signal lines with a one-to-one correspondence; for each of the N scan drive units, a forward scan input terminal of a current-stage scan drive unit is electrically connected to a shift signal output terminal of a previous-stage scan drive unit of the current-stage scan drive unit, a backward scan input terminal of the current-stage scan drive unit is electrically connected to a shift signal output terminal of a next-stage scan drive unit of the current-stage scan drive unit, and a forward scan input terminal of a first-stage scan drive unit and a backward scan input terminal of an Nth-stage scan drive unit are both electrically connected to the start signal pin, wherein the current-stage scan drive unit is not the first-stage scan drive unit and not the Nth-stage scan drive unit; and a first gating circuit comprising a first switch unit and a second switch unit, wherein an input terminal of the first switch unit is electrically connected to a scan signal detection terminal of the Nth-stage scan drive unit, an input terminal of the second switch unit is electrically connected to a scan signal detection terminal of the first-stage scan drive unit, an output terminal of the first switch unit and an output terminal of the second switch unit are both electrically connected to the detection signal pin; the first switch unit is configured to turn on in a forward scan detection stage and turn off in a backward scan detection stage, and the second switch unit is configured to turn on in the backward scan detection stage and turn off in the forward scan detection stage, wherein the scan signal detection terminal of the Nth-stage scan drive unit is a shift signal output terminal of the Nth-stage scan drive unit or a scan signal output terminal of the Nth-stage scan drive unit, and the scan signal detection terminal of the first-stage scan drive unit is a shift signal output terminal of the first-stage scan drive unit or a scan signal output terminal of the first-stage scan drive unit.

* * * * *